United States Patent [19]

Schaffner

[11] 4,374,412
[45] Feb. 15, 1983

[54] CIRCULATING PAGE LOOSE SYSTEM

[76] Inventor: Mario R. Schaffner, 3455 Table Mesa Dr., Apt. 228K, Boulder, Colo. 80303

[21] Appl. No.: 147,671

[22] Filed: May 7, 1980

Related U.S. Application Data

[63] Continuation of Ser. No. 573,211, Apr. 30, 1975, abandoned, which is a continuation of Ser. No. 328,526, Feb. 1, 1973, abandoned, which is a continuation-in-part of Ser. No. 184,598, Sep. 28, 1971, abandoned, which is a continuation-in-part of Ser. No. 779,824, Nov. 29, 1968, abandoned, which is a continuation-in-part of Ser. No. 640,180, May 22, 1967, abandoned, which is a continuation-in-part of Ser. No. 533,741, Feb. 1, 1966, abandoned, which is a continuation-in-part of Ser. No. 458,692, May 25, 1965, abandoned.

[51] Int. Cl.³ .................... G06F 15/06; G06F 15/347
[52] U.S. Cl. .................................................. 364/200
[58] Field of Search ... 364/200 MS File, 900 MS File

[56] References Cited

U.S. PATENT DOCUMENTS

| | | | |
|---|---|---|---|
| 3,346,851 | 10/1967 | Thornton et al. | 364/200 |
| 3,544,969 | 12/1970 | Rakoczi et al. | 364/200 |
| 3,560,934 | 2/1971 | Ernst et al. | 364/200 |
| 3,573,851 | 6/1971 | Watson et al. | 364/200 |
| 3,614,745 | 10/1971 | Podvin et al. | 364/200 |
| 3,657,736 | 4/1972 | Boom et al. | 364/200 |
| 3,665,487 | 5/1972 | Campbell et al. | 364/200 |
| 3,858,182 | 12/1974 | Delagi et al. | 364/200 |
| 3,962,706 | 6/1976 | Dennis et al. | 364/200 |
| 4,041,461 | 8/1977 | Kratz et al. | 364/200 |
| 4,253,145 | 2/1981 | Goldberg | 364/200 |

OTHER PUBLICATIONS

*Special Purpose versus General Purpose Machines in Signal Processing,* M. R. Schaffner, The Nat'l Center for Atmosphere Research, Boulder, Colo., pp. 1-8.

*Processing by Data and Program Blocks* (revised), M. R. Schaffner, MIT Paper, Cambridge, Mass. 3/78, pp. 1-34 (8 Figures).

*Processing by Data and Program Blocks,* M. R. Schaffner, IEEE Transactions on Computers VC-27, No. 11, 11/78, pp. 1015-1028.

M. R. Schaffner, *On the Characterization of Weather Radar Echoes,* 16th Radar Meteorology Conference, 4/22-24/75, pp. 516-536.

*Language Particularly Effective for Pattern Recognition Programs,* M. Schaffner, Cognitive INformation Proc'g Group Seminar-9/7/76 (seven pages).

*Processing by Data and Program Blocks*-M. R. Schaffner, MIT paper, Cambridge, Mass. 2/18/77, pp. 1-28 (plug eight Figures).

*A Technique for Real-Time Data Preprocessing*-M. R. Schaffner, Purdue University Symposium-6/77, pp. 1-9.

*Primary Examiner*—Harvey E. Springborn

[57] ABSTRACT

A computer having a programmable network assumes specialized operating configurations corresponding to the functions to be executed at each cycle. For such a computer, the program consists of the description of a Finite State Machine (FSM) that performs the desired process. The language for describing these FSMs consists of digital words formed with a grammar similar to that of spoken languages. This language is equally well suited for expressing the processes that the user has in mind and for actually controlling the computer, thus making the compiler unnecessary. The data related to each FSM are organized in the form of pages that circulates between the registers of the programmable network and a memory that configurates itself as the data, thus making the burden of addressing unnecessary.

12 Claims, 25 Drawing Figures

FIG. 15
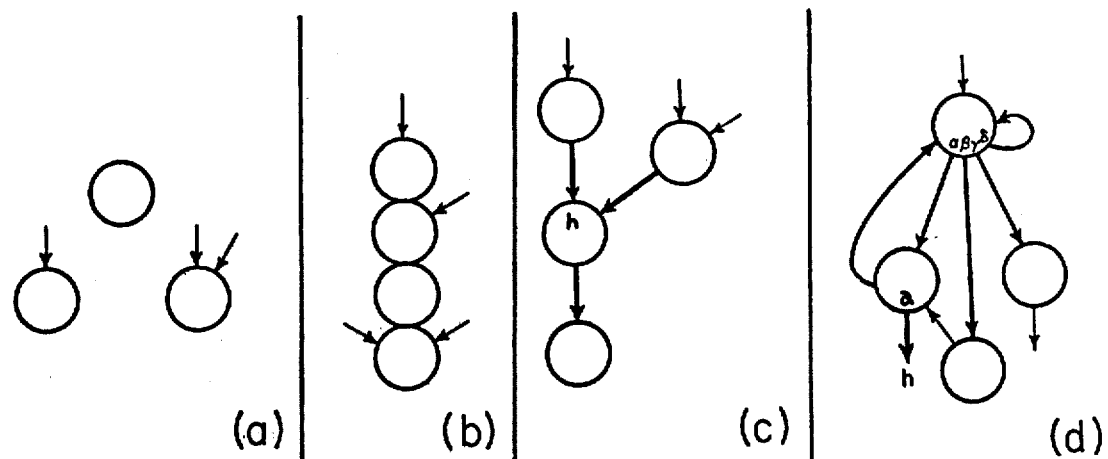
(a) (b) (c) (d)
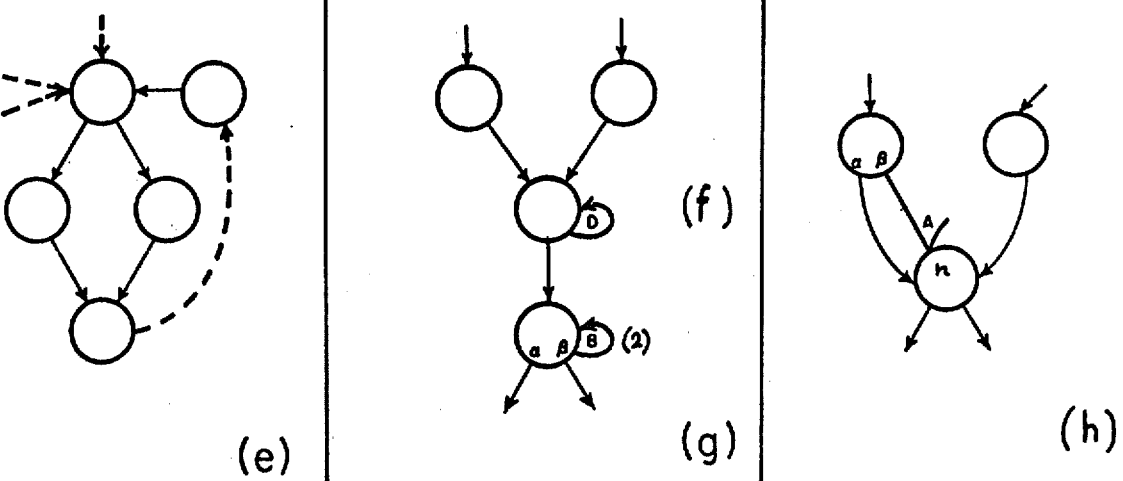
(e) (f) (g) (h)
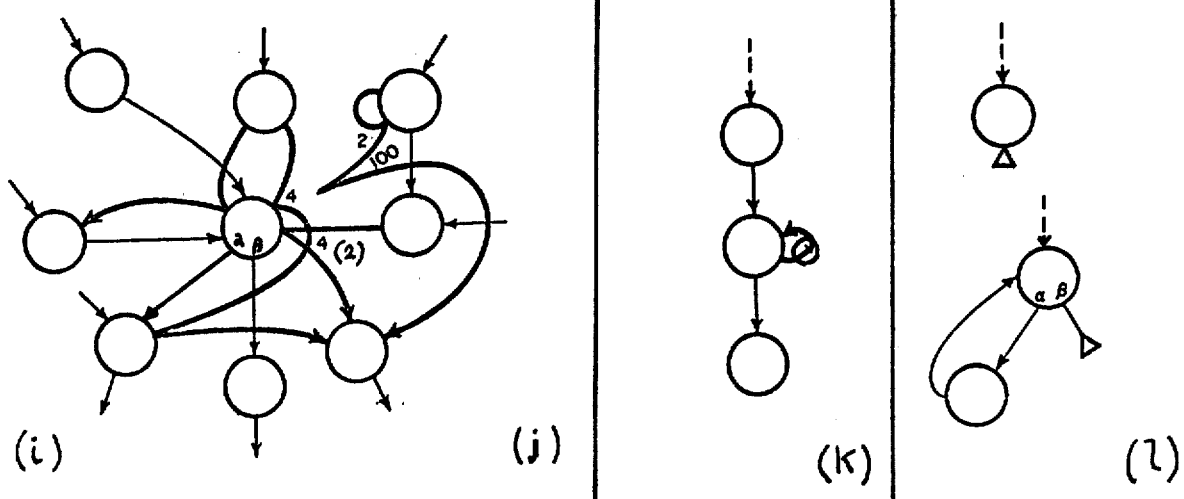
(i) (j) (k) (l)

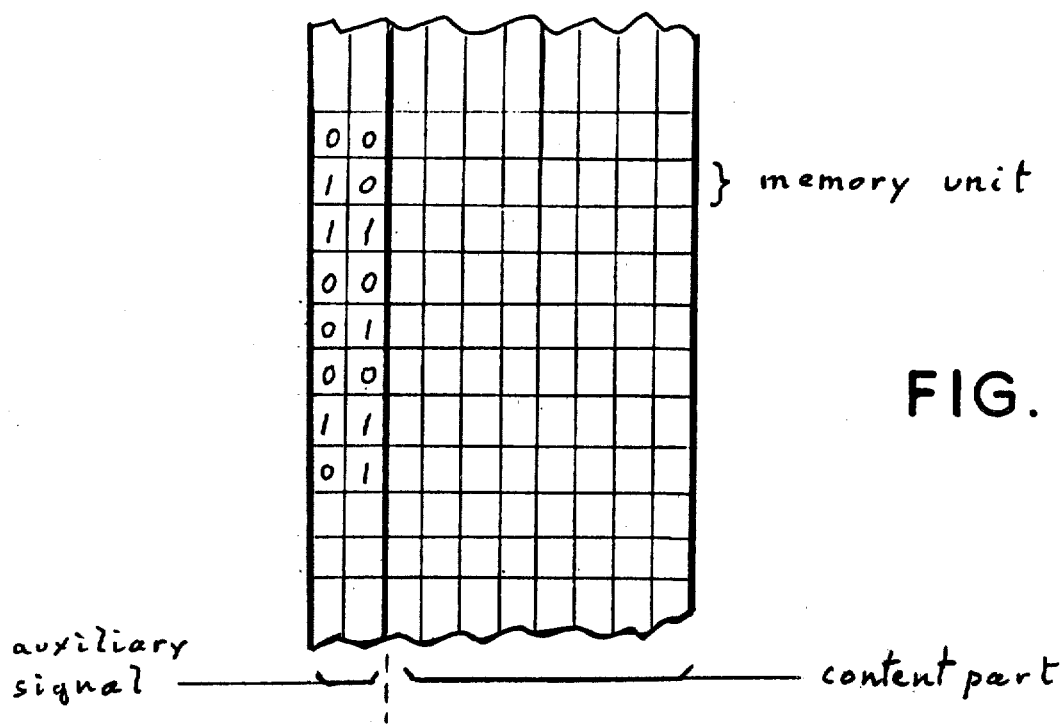
FIG. 22
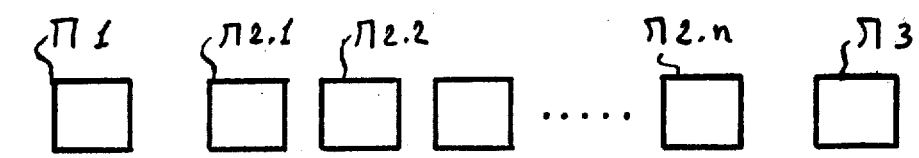
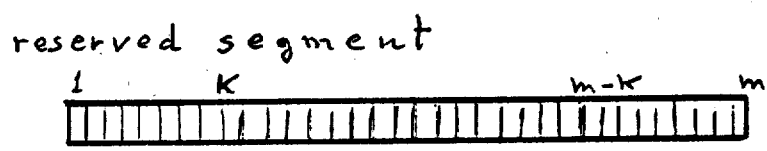
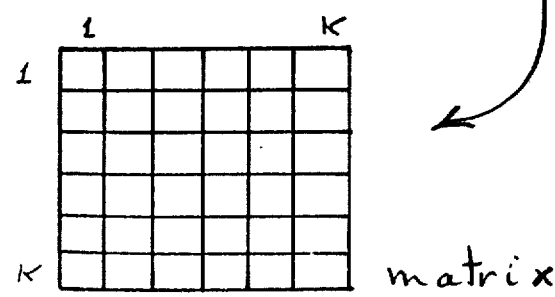
FIG. 25

CIRCULATING PAGE LOOSE SYSTEM

RELATED APPLICATIONS

This application is a continuation of my co-pending Application Ser. No. 573,211, filed Apr. 30, 1975, which is now abandoned and is a continuation of my Application Ser. No. 328,526, filed Feb. 1, 1973, which is now abandoned and is a continuation-in-part of my Application Ser. No. 184,598, filed Sept. 28, 1971, which is now abandoned and is a continuation-in-part of my Application Ser. No. 779,824, filed Nov. 29, 1968, which is now abandoned and is a continuation-in-part of my Application Ser. No. 640,180, filed May 22, 1967, which is now abandoned and is a continuation-in-part of my Application Ser. No. 533,741, filed Feb. 1, 1966, which is now abandoned and is a continuation-in-part of my Application Ser. No. 458,692, filed May 25, 1965 which is now abandoned.

FIELD AND OBJECTS OF THE INVENTION

This invention relates to general-purpose computers. The invention departs from prior art stored-program digital computers in that the program configurates the hardware according to the process to be executed. More precisely, the invention takes advantage of the innate facility of humans to think of a process as an abstract machine; these abstract machines are described by the user in the rigorous form of a Finite State Machine, and then the descriptions of these Finite State Machines are used as programs for the hardware to be configurated.

The prime object of this invention is the use of Finite State Machines as a unique programming language that is well suited for expressing what the user has in mind, and at the same time is an efficient machine-language for a configurable hardware. The compiler programs of the prior art are, therefore, unnecessary.

Another object of the invention is to provide a computer architecture that can be programmed for much different specializations to make real-time processing practical. A further object is to provide a computer that efficiently executes in time-sharing a large number of independent jobs. A further object is to provide computer means that substitute for the cumbersome addressing functions and address manipulation.

It is another object of the instant invention to provide a programmable hardware by which the complex software systems needed by today's computers are simplified. It is a further object to provide a computer that can learn specific functions as required in the different applications.

Other objects and various advantages and features of the invention will become apparent by reference to the following description taken in connection with the appended claims and the accompanying drawings forming a part thereof.

BRIEF DESCRIPTION OF THE DRAWINGS

FIG. 15 shows preferred transition functions;

FIG. 22 relates to a sequential storage medium;

FIG. 25 relates to the organization of the pages in a program;

DESCRIPTION OF THE INVENTION

Figure 1:
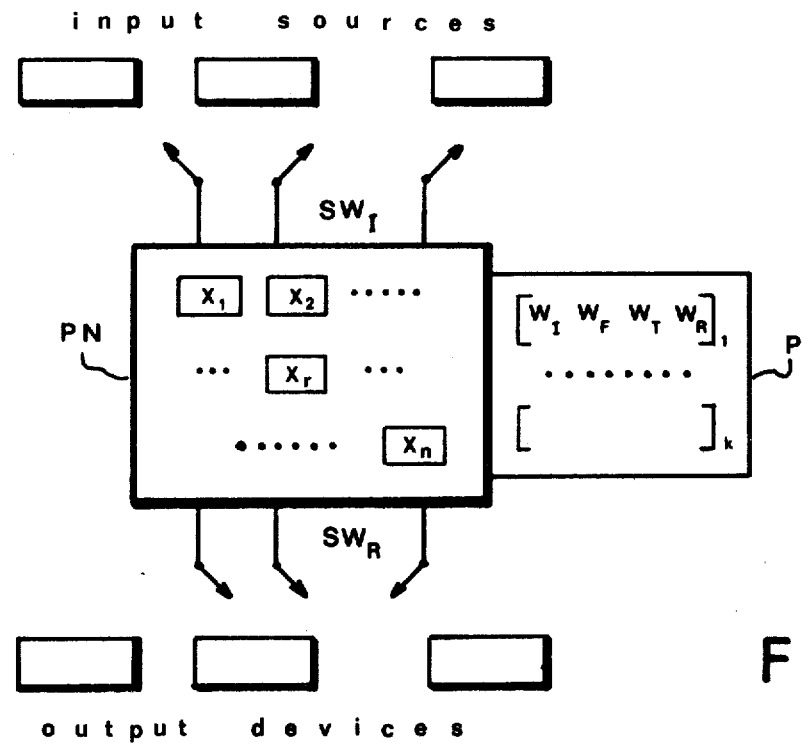
FIG. 1 is a functional block diagram of a Finite State Machine, which is the theoretical model of this invention.

PART I—INTRODUCTION 1.1 In the prior art, an object program consists of pluralities of instruction sequences, from a given instruction set, such that the given computer (a factory designed hardware) simulates in some form the desired process. Because of the cumbersomeness of these instruction sequences, a variety of high level languages have been developed, such that user produces a source program at a level more appropriate for each field of application. This approach has led to the proliferation of languages, to the necessity of compiler programs, and to the difficulty of debugging because the completely different form that a process has in the source and in the object programs. Moreover, in the prior art, data is stored in random access memories, and they are moved, one at a time, by means of addresses. This leads to the problem of access time, and adds complexity to the hardware and software for all the required address manipulations.

The present invention eliminates said inconveniences by using programmable networks and programmable storages as hardware, and Finite State Machines as programming language.

1.2 Programmable Networks

The notion of formal networks for executing logical activities was introduced by McCulloch and Pitts [1] in their study on the activity of the neural systems. The possible importance of this notion for computers was pointed out by von Neumann [2], from which an excerpt is reported as an appendix.

The notion of logical networks corresponding to logical activities has been extended in this invention to the notion of a programmable network. Let us consider a sufficiently large logical network and divide the input lines of the network into two categories: a first one, that includes the lines carrying the variables of the process to be executed, which we call process input; and a second one which we call program input. Supposing, without loss of generality, that all the program input lines carry binary signals, the ensemble of these signals (say they are m) corresponds to a digital word W of m bits. For each different W, the network is a different one, and performs a different process. Thus, we have clarified the possibility for a general logical network that, in response to digital words W, performs different logical activities. We call this a "programmable network" (PN).

Because the correspondence between a logical activity F and a logical network $N_F$, pointed out in the von Neumann quotation, and because the correspondence between a logical network $N_F$ and a digital word $W_F$, expressed above, we can consider the following mapping:

$$F \rightarrow N_F \rightarrow W_F \quad (1)$$

In other words, given a logical activity F, it is possible to have that activity executed, by giving a proper word $W_F$ to a suitable programmable network PN.

This procedure is more direct than that of prior art consisting of simulating the desired process by means of sequences of instructions given to a hardware already designed for a limited set of elementary operations. The present invention discloses means for implementing the mapping (1). Section 1.3 summarizes the mapping from F to $N_F$, and Section 1.4 the mapping from $N_F$ to $W_F$.

1.3 The Finite State Machine (FSM)

Whenever F represents little more than a trivial activity, the definition of a network $N_F$ capable of performing that activity becomes an unpractical task; a team of engineers would be necessary for each program. It is a feature of this invention to use a peculiar programmable, sequential automaton, by means of which any complex activity can be broken down into simple symbolic networks.

When we clarify a process in our minds, we naturally think of a kind of mechanization of it, i.e., an abstract machine that, because of its structure, produces the desired process. We define here a type of abstract machine able to constitute a common framework for all abstract machines we may think of in dealing with processes for a computer. This common framework is a particularly formulated finite state machine, which we call FSM. Finite state machines [3] are in use today as models of computations [4], digital circuits [5] and neural systems [6].

Our FSM is constituted by a programmable network PN embedded with a set of internal variables $x_r$, FIG. 1, by a set of switches $SW_I$ capable of connecting some process inputs of PN to outside input data $u_r$, by a set of switches $SW_R$ capable of connecting some of the variables $x_r$ to output devices, and by a storage P for the program consisting of quadruplets j describing the states of the FSM. A state is defined by a quadruplet [I,F,T,R] where I is a prescription for the switches $SW_I$, F is a function on the variables $x_r$ and data $u_r$, T is a function on the same variables (transition function) that determines the next state, and R is a prescription for the switches $SW_R$.

A process thus can be expressed by the two following expressions:

$$X(i+1) = F_{s(i)}[X(i),U(i)] \quad (2)$$

$$S(i+1) = T_{s(i)}[X(i+1),U(i)]$$

where X is the set of the variables $x_r$, U the set of input data $u_r$, s(i) and s(i+1) the present and the next state, respectively, and i is a discrete representation of time expressed as the sequence of cycles of PN. An FSM of k states is thus described by k quadruplets:

$$[I,F,T,R]_j \, j=1,2,3,\ldots k \quad (3)$$

In modeling a process A in the form of an FSM, we break A in many pieces, those constituting the quadruplets (3). For the pieces $F_j$ and $T_j$ it is now feasible to conceive corresponding networks $N_{Fj}$ and $N_{Tj}$ described by words $W_{Fj}$ and $W_{Tj}$. At each discrete time, i, PN has a cycle; the word $W_F$ of the previously selected quadruplet (the present state) is connected to the program input of PN, and new values of $x_r$ are produced; then, the word $W_T$ is connected to the program input of PN, and a new quadruplet is selected for the next cycle. The selected quadruplets control also switches $SW_I$ and $SW_R$, responsive to the words $W_I$ and $W_R$, respectively.

Note that in this approach, the pieces $I_j$, $R_j$, $T_j$, and $R_j$ are formed by the user, in accordance with the requirements of the process. This is opposed to the approach of prior art in which the processes have to be badly deformed in order to be expressible in the given pieces of the computer language—the instructions.

1.4 The Power of a Language

A spoken language has the capability to express an unlimited variety of complex informations with simple means—an alphabet of 20–40 symbols, and a set of grammar rules. Programming languages of prior art make a little use of the features of spoken languages. One of the features of the present invention is the use of inflections and conjugations in order to make possible the description of complex networks $N_j$ by means of digital words $W_j$. Furthermore, these words are constructed with a language meaningful to the user.

The interesting point is that such a language does not constitute a specialization that the user has to acquire, because all of us are familiar with these features through the spoken language. The Tables of section 4.3 are examples.

1.5 Addresses and Pages

One of the fundamentals of prior art is the use of an addressable main memory. While this feature permits the access to any data, at any point of a computation, it constitutes the heaviest burden in the hardware (most of the registers contain addresses), and one of the overheads of the software (e.g., relative address transformations).

In the present invention the data of each FSM reside in the registers of the programmable network PN. The user prepares the networks according to the location of the data. The ensemble of data and their position in the PN is called a page. When a page has to be removed and then returns into the PN, all the data resume their original location, if otherwise prescription is not made. Therefore, addresses are not used during computation.

There are cases in which other pages, or outside storages have to be addressed; but in all these cases, the address indeed corresponds to a value of some variable $x_r$ or $u_r$ of the process. Accordingly, the routing R, as described in Sections 3.4 and 4.5, has the capability to use some of the variables as addresses. In conclusion, addresses can be divided into two types: (a) those introduced artificially because the computer uses an addressable memory and (b) those that are an actual mechanism of the process. The first are not needed in this invention; the second are dealt with as part of the process, by means of proper networks, and R and I prescriptions.

PART 2—DESCRIPTION OF THE INVENTION

2.1 General Outline

In the previous part, the principles on which the invention is based have been outlined. In this part, the technique for constructing a computer working on those principles is disclosed.

Most of the processes that are given a computer have such a complexity that the user has to decompose them into many FSMs treated independently. Moreover, a computer is often required to deal with many jobs in time sharing. Accordingly, the present invention has means that permit the simultaneous performance of a large number of FSMs which use the same programmable network, in time sharing.

Figure 2:
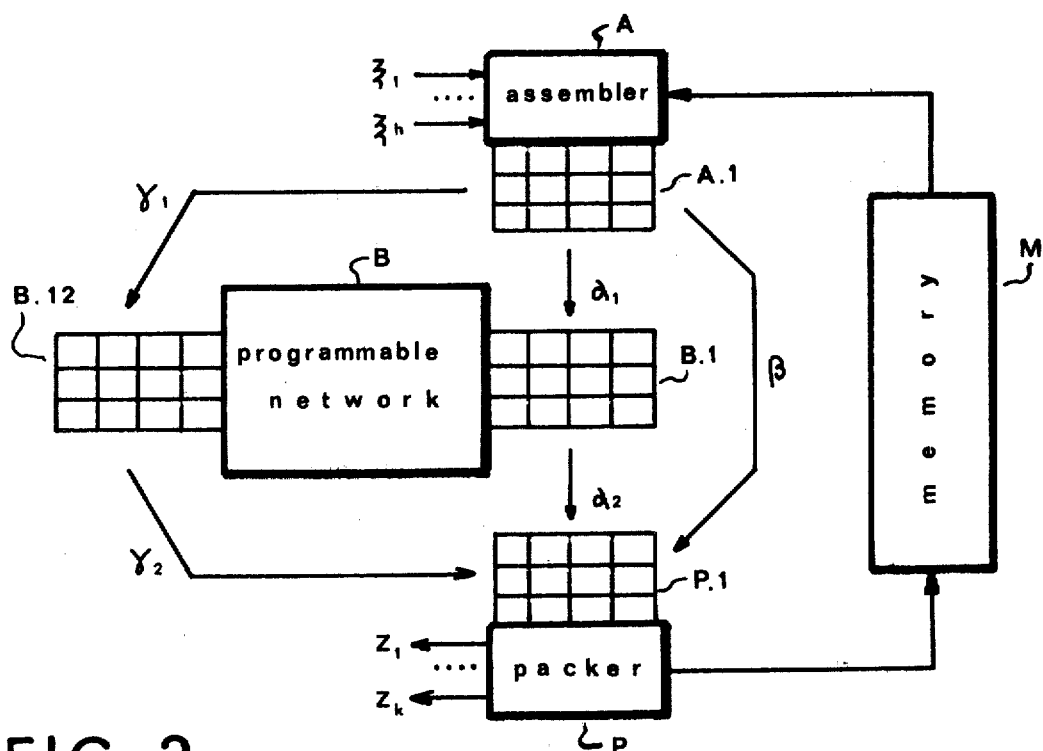
FIG. 2 is a functional block diagram of the present invention.

FIG. 2 shows the main constituents of the invention: a programmable network B embedded with an array of registers B.1 for holding a page, as defined in Section 1.5, called page array, and an auxiliary page array B.12; an assembler A including a page array A.1, and lines $\xi$, ... $\xi_h$ connecting to the sources of input data and auxiliary storages; a packer P including a page array P.1, and lines $z_1 \ldots z_k$ connecting to output devices and auxiliary storages; and a memory M with its input connected to said packer and its output connected to said assembler.

The data of an FSM, as defined in Section 1.3, are introduced into the system through the lines $\xi_1$—$\xi_h$, forming a page in the array A.1. The page, at this moment, contains input data $u_r$ and the quadruplet (3) of the starting state. Then, the page is transferred in parallel (path $\alpha_1$) into the array B.1 embedded with the programmable network. Here the word $W_F$ of the quadruplet implements a particular network that produces internal variables $x_r$, and the word $W_T$ implements a network that determines the label of the next state $s(i+1)$. Then, the page is transferred in parallel into the array P.1 (path $\alpha_2$). Here the word $W_R$ might control the routing of some variables $x_r$ into output devices through the lines $z_1$—$z_k$; the next state label and the internal variables $x_r$, together with the information of their location in the array, are packed in the form of a compact page, and sent into the memory M. At a subsequent time the page is sent from the memory to the assembler; here the variables $x_r$ are allocated into the array A.1 in the prescribed order of registers, the next state label acquires the quadruplet describing that state (which from this moment becomes the present state), and the word $W_I$ of the present quadruplet acquires the new input data $u_r$. Then the actions repeat themselves as described.

With repeated circulations, a page performs the process as described by the FSM to which the page belongs. Many pages can perform the same FSM, many FSMs can be performed by pluralities of pages, and different pages can perform different FSMs that are parts of a same large process. In this latter case, the auxiliary array B.12 is used for transferring data from one page to another; a page presently in B.1 can transfer some variables $x_r$, or component of quadruplet, or control signals into array B.12, by means of a proper configuration of the network; another page, when in transit through B.1, can acquire the data in B.12, through appropriate configurations of the network.

The memory M is constituted by a storage medium that can be organized at each moment into different structures in accordance with the structure of the pages under processing. In the normal configuration, memory M provides the pages to the assembler in the same order in which they were received from the packer; in other words, it acts as a first-input-first-output (FIFO) storage. For particular processes, the order of the pages can be different in accordance with the content of routing words $W_R$ given by the packer to the memory.

Of frequent application is the feature that part of the memory M can act as a processing memory. As it will be described in detail in Section 4.7.4, single data can be routed into specific sections of the memory as argument of specific functions such as accumulation, substitution with the largest value, etc. In this case, data are entered in an addressed form.

Means for transferring a page directly from A.1 to P.1 (path $\beta$) are provided for the circulation of pages that do not perform operations F and T, but only acquisition of new data (prescription I) or routing out of results (prescription R). In this case, the architecture of FIG. 2 performs the tasks that usually are executed by additional peripheral processors. Similar transferring means are provided between A.1 and B.12 (path $\gamma_1$) and between B.12 and P.1 (path $\gamma_2$) for changing the sequential order of the pages.

After the characterizing features of the invention, the loose structure of the processor and memory, the organization of the FSMs in the form of independent pages, and the automatic circulation of the pages, it has been named the Circulating Page Loose (CPL) system.

2.2 The Assembler

The assembler has the role of assembling data of an FSM, streaming from the memory and from outside sources, into the page array A.1 (FIG. 2). A conventional bus, with conventional transfer means, connects the output of the memory M to the registers of A.1. In the preferred embodiments of the memory described in Section 4.7, the several parts of a page are distinguished by their position in the sequence and by auxiliary signals. Accordingly, the assembler recognizes the data arriving from the memory by their sequential order of arrival and by the received auxiliary signals. At the reception of the signal "new page," the transferring means from bus to registers are activated; in the preferred sequence the first word is the "name" of the page and is stored in register A.1.1 of the array A.1; the second word is the "key-word" (to be further described) and is stored in register A.1.2, FIGS. 3 and 12.

The following words constitute the quadruplets of the FSM, in the sequence of the state label, and they are stored in registers A.1.31 through A.1.39. In typical programs, the same functions F and T are used in several states; in order to not repeat several times the words $W_F$ and $W_T$ describing these functions, in the preferred embodiment words $W_F$ and $W_T$ are given only once, in an arbitrary sequence, after the sequence of the quadruplets. Correspondingly, the quadruplets, in place of words $W_F$ and $W_T$, contain numbers indicating the positions of those words in said sequence. In accordance, the assembler, at the reception of the signal "new category" (nc), stores the following words (which are the $W_F$ and $W_T$) in registers A.1.411 through A.1.419. At the next nc signal, the assembler stores the following words into registers A.1.511 through A.1.519; in the preferred page format, these words constitute the input data $u_r$. At the following nc signal, the assembler stores the following words, which in the preferred page format represent the variables $x_r$, into registers A.1.61 through A.1.69.

In the same time that the transfer means operates said differentiated allocation of the page words, control means A.21 reads a part of the key word A.1.2 that contains the present state label; responsive to this label, A.21 selects and transfers the quadruplet of the present state from registers A.1.31 through A.1.39 to register A.1.3.

Figure 3:
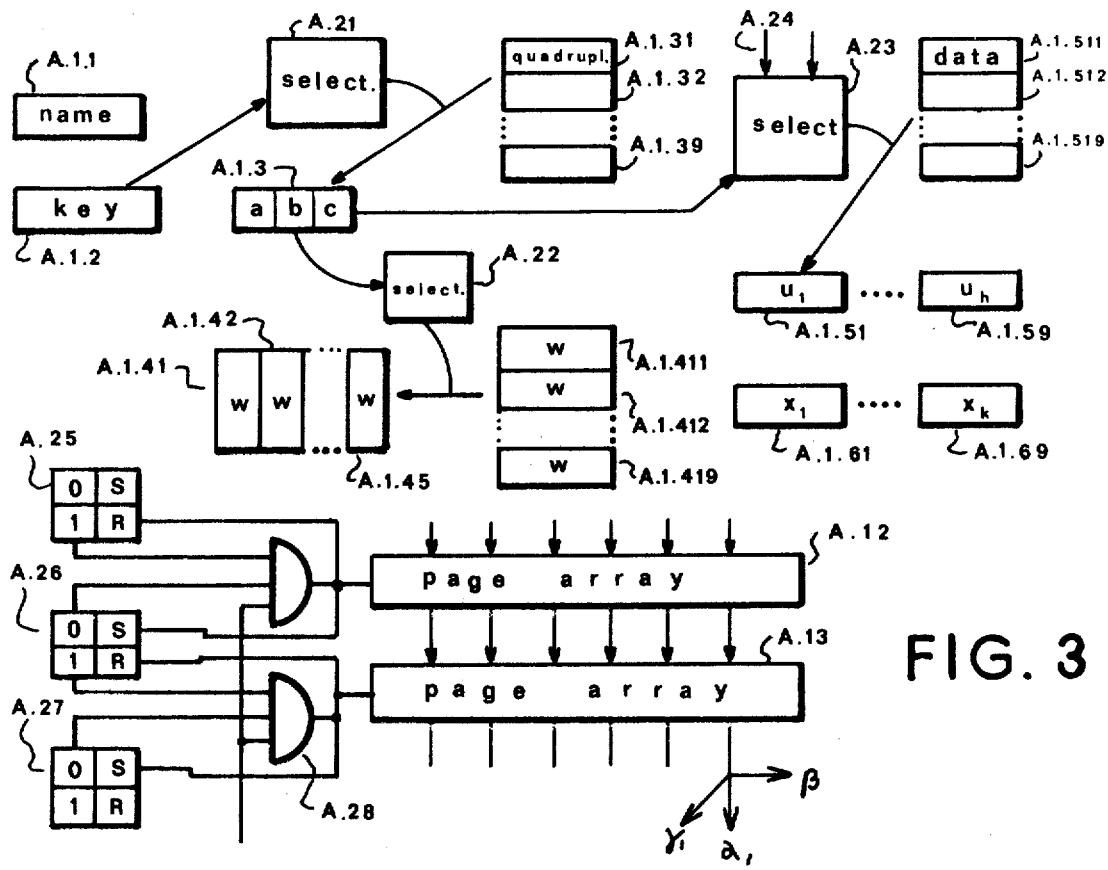
FIG. 3 is a block diagram of the assembler, which prepares the data in accordance with the organization into pages.

Responsive to word $W_I$, allocated in section c of register A.1.3, control means A.23 selects the present input data $u_r$ from registers A.1.511 through A.1.519, or from lines $\xi_1 \ldots \xi_h$ (FIG. 2), such as the line A.24 in FIG. 3, and transfers them into registers A.1.51 through A.1.59. Responsive to said numbers addressing words $W_F$ and $W_T$, located in section b of register A.1.3, control means A.22 selects and transfers words $W_F$ and $W_T$ from registers A.1.411 through A.1.419 into registers A.1.41 through A.1.45.

In order to not slave the timing of the programmable network to said preparation of the pages in A.1 and vice versa, the assembler is provided with buffer page arrays such as A.12 and A.13. When the allocation of data in the page array constituted by registers A.1.1, A.1.2, etc. is accomplished, flip-flop A.25 is set; if flip-flop A.26 is reset (denoting A.12 empty) the page is transferred into array A.12; if also A.27 is reset, the page is transferred further into array A.13. From here the page can continue its circulation through path $\alpha$, $\beta$ or $\gamma$.

Figure 4:
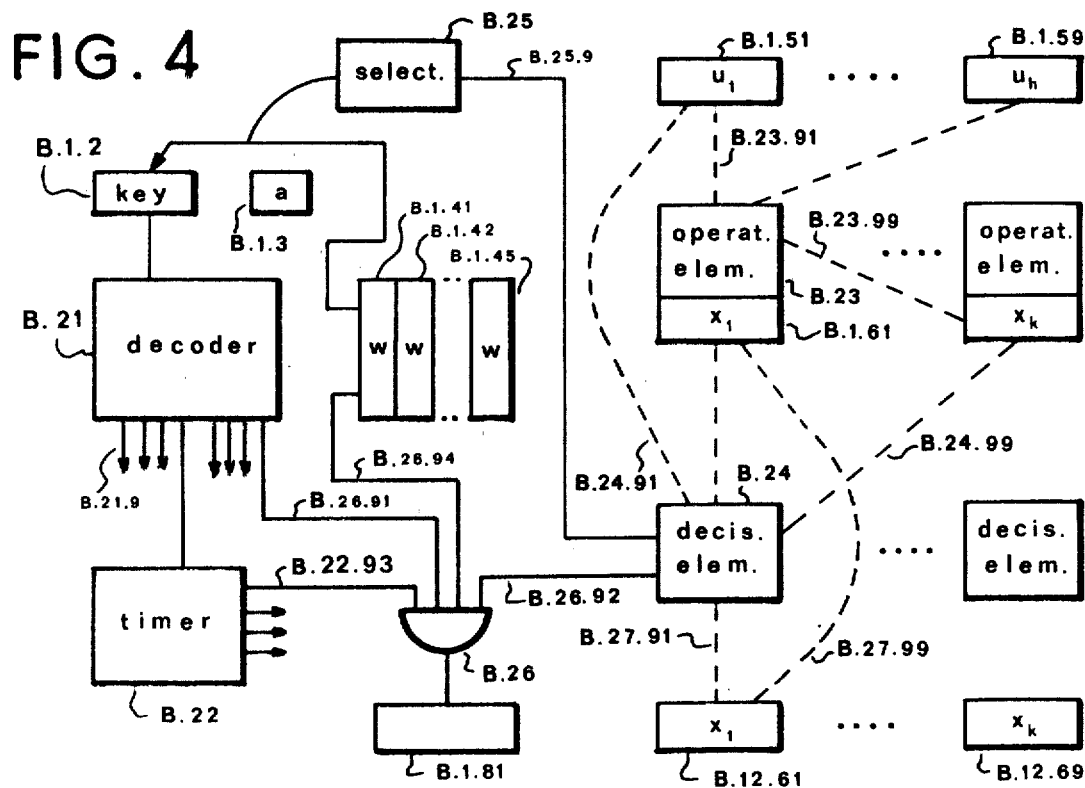
FIG. 4 is a block diagram of the programmable network.

2.3 The Programmable Network 2.3.1 The significant parts of the programmable network are indicated in FIG. 4. Conventional transfer means are provided for transferring in parallel a page from array A.13 of the assembler into array B.1 of the programmable network. Arrays A.1 and B.1 correspond register by register; the same decimal numeration is used for corresponding registers in FIGS. 3, 4 and 8. As a page is transferred into B.1, a timer B.22 controls the following steps:

(1) A decoder B.21 reads simultaneously the key word (located in register B.1.2), and the word W (located in register B.1.41). Responsive to the content of these registers, the decoder produces an activating or disabling level in all the lines, such as B.21.9, that controls the programmable network. Among the functions controlled are the timing pulses produced by timer B.22. Thus, the programmable network, with the specialized configuration assumed in response to the content of registers B.1.2, B.1.3 and B.1.41 are under control of the timer B.22, executes a cycle of operations.

(2) At the end of this cycle, a pulse from the timer causes all the contents of the W registers to shift to the next register: the content of register B.1.41 shifts, the content of B.1.42 goes to B.1.41, the content of B.1.43 goes to B.1.42, etc.; Step (1) is then repeated.

(3) When the entire process prescribed by words W of that state is executed, a last pulse of the timer transfers the present content of the entire page array B.1 into the corresponding page array P.1 of the packer. From this time on, the programmable network can receive, in one clock pulse, a new page from the assembler.

Among the controlled characteristics of the programmable network are the operations of the elements and the connections to them. In FIG. 4 these are diagramatically indicated: connections such as B.23.91 between an input $u_r$ register B.1.51 and an operating element B23; connections such as B.23.99 between a variable $x_r$ register and an operating element; connections such as B.24.91 between an input register and a decision element B.24; connections such as B.24.99 between a variable register and a decision element; and connections such as B.27.91 and B.27.99 between a register B.12.61 of the page array B.12 and an operating element and a decision element.

For a programmable network to assume a specialized configuration corresponding to a particular function F or T, all the information necessary for its specialization needs to be provided simultaneously. It is a feature of this invention to take advantage of the simultaneity of the control of the entire PN for correlating to the full all the bits constituting the description of the configuration in order to reduce the total number of bits required. The choice of these correlations is arbitrary, from the viewpoint of the digital design. It is a further feature of this invention to choose these correlations in such a way as to form a language with a grammer easy to be learned by the user in order to form the words W. The implementation of these features will be apparent in the course of the description of the decoder and of the language.

With N bits, $2^{2^N}$ functions exist [7]. Such functions can be assigned to the control of single characteristics of PN. The number of these functions is exceedingly large, also for N small as 16 or 32 (common size of digital words), that a specific choice of the functions can be made such as to form an appropriate language for the words W. In one preferred embodiment of the language (described in Part 3), words W are divided into prefix, root, detail and suffix; the semantics of each of these parts is generally different for different content in the other parts. The logical connections of the grammar of the language dictate the connections of the elements of decoder B.21 (Section 4.1).

Functions F operate typically on the variables $x_r$ which are held by registers such as B.1.61. These registers have input and output connected to an ensemble of circuits B.23, which are connected also to other registers of the network. Under the control of decoder B.21 and timer B.22, new values are produced in the registers such as B.1.61 as a function of the previous content in these registers and in the other registers.

Functions F are used also for controlling other parts of a process. In these cases, the program word in B.1.41 activates the trait control B.26.91 which, through a series of gates, such as B.26, and the optional dependency on some decision through connection B.26.92, at the time given by the line B.22.93, transfers some bits of the program word through connection B.26.94, or some variable in the network, into register B.1.81. The transferred content will be used by the packer, as later explained, for executing the control function.

Functions T produce configurations that lead to the choice of the next state. A word $W_T$ in B.1.41 activates connections between registers and decision elements; outputs of a decision element, such as B.25.9, go to means B.25 for selecting and transferring a new key word from the W registers into register B.1.2. The page, after one circulation, returns to the assembler which, reading the key word, will display the information related to the new state into registers, A.1.3, A.1.41 . . . A.1.45.

2.4 The Packer

Figure 8:
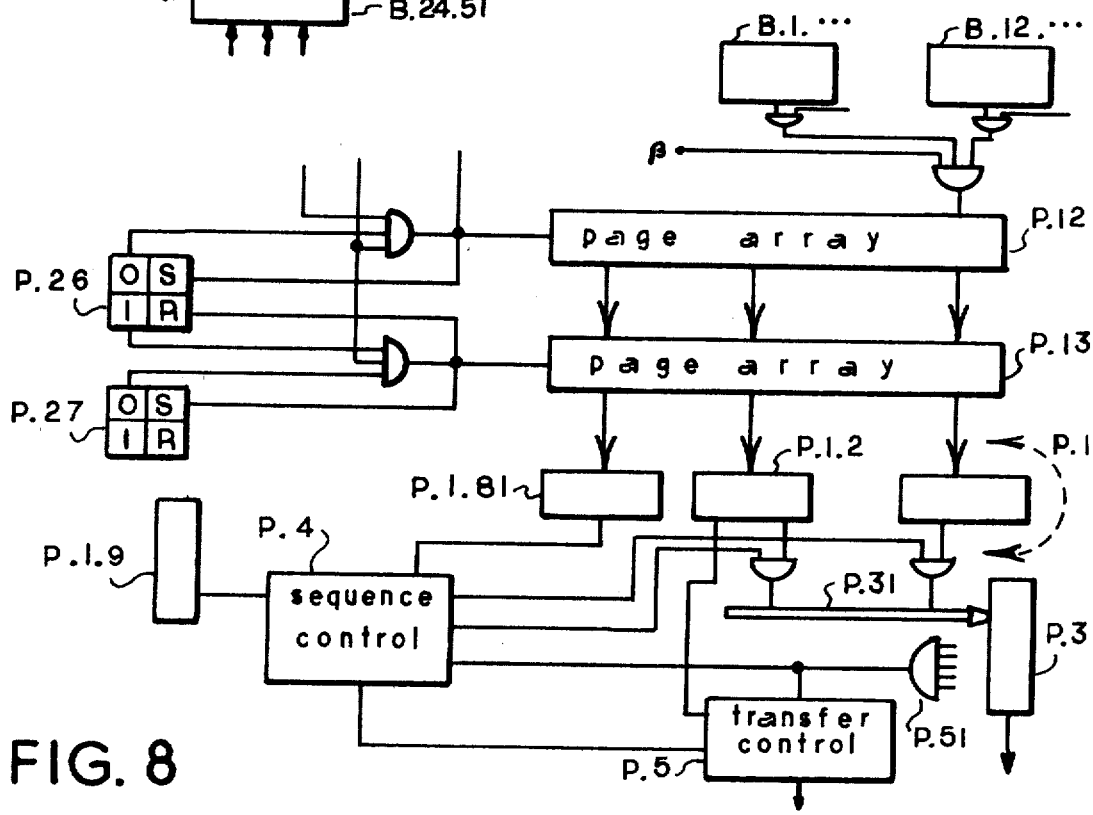
FIG. 8 is a block diagram of the packer which prepares the data for transmission into the memory.

A preferred embodiment of the packer is diagramatically shown in FIG. 8. Conventional transfer means provide the transfer of a page in parallel from page array B.1 into page array P.12. Arrays P.12 and P.13, and flip-flop P.26 and P.27 perform a buffering function similar to that implemented by arrays A.12, A.13, flip-flop A.25, A.26 and A.27 in the assembler. The number of buffer page-arrays depends on the wanted degree of independence between the computing time and the time of transmission into the memory, which is proportional to the length of the page and of bit rate. In the design of a CPL system, said bit rate should be related to the average computing time in PN and average page length.

The words in the last page array P.1 are transferred one at a time into the register P.3 by means of the bus P.31. The sequence of these transfers is controlled by the circuit P.4, responsive to the $W_R$ words in register P.1.81. In this way the page, when it is again displayed by the assembler, can have any allocation of the words in the page registers, as ordered by the operating unit in the previous cycle, by said code word in register B.1.81.

Every time a word is transmitted from P.3 to the memory, means P.5 produces an auxiliary signal and P.4 jumps one step in the sequence of registers to be connected to bus P.31.

2.5 The Memory and the Circulation of the Pages

The packer has means for packing the data of an FSM, as delivered by the programmable network, into the form of a page of data; the assembler has means for displaying a page of data, as furnished by the memory, into the registers of the programmable network. Thus, the memory has only the task of holding pages in the given order, without concern for addressing means for the single data. This fact allows the use of simple and thus less expensive storage media.

Said order of the pages is related to the processes and their data structures, therefore, in general, it varies continuously in time. Accordingly, the memory has means for selecting the segments of pages that are provided to the assembler, responsive to the content of words that are routed by the packer to said means of the memory.

The size of a page is different for different purposes; accordingly, a different extent of storage medium is used for the different pages, responsive to auxiliary signals produced by the packer. When a page is reduced to a single datum, the same retrieval capability of the random access memories is reached.

If an FSM consists of one or few states, it is convenient to store the entire FSM description in a part of the page that will appear in registers of the assembler such as A.1.31 and A.1.411 of FIG. 3. When the FSM descriptions are long, it is convenient to use an outside auxiliary memory, equivalent to registers A.1.31 . . . , from which the assembler acquires the quadruplet of the present state, addressed by the name of the FSM and the present state label. Similar considerations hold for the input data.

Figure 12:
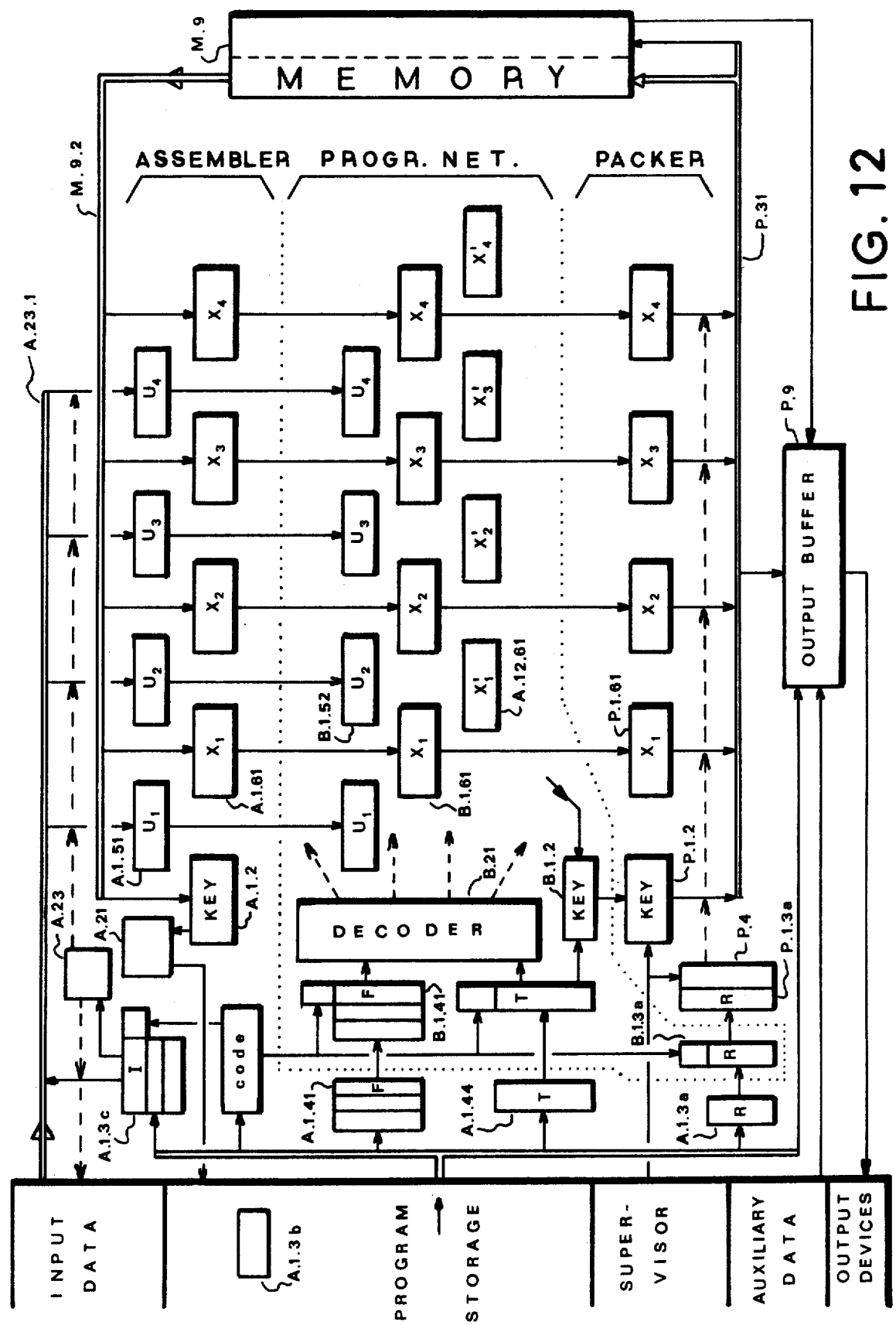
FIG. 12 shows the elements pertinent to the circulation of the pages.

FIG. 12 shows the elements of the assembler, PN, packer, and memory pertinent to the circulation of the pages, in an exemplifying simple environment. From the memory output-bus M.9.2, the name, the key word and the variables $x_r$ of a page are allocated in registers A.1.1, A.1.2, A.1.61 . . . , respectively. Input means A.21, in response to the name in A.1.1 and the state label in A.1.2, acquires the quadruplet of the present state through bus A.21.1. The $W_I$ words are stored in A.1.3c, the $W_F$ and $W_T$ words in A.1.4i and the $W_R$ words in A.1.3a, all in a given sequential order. Means A.23, responsive to the content in A.1.3c, acquires input data from outside sources or storages, through bus A.23.1, in a given sequential order and allocates them in registers A.1.51 . . . .

At the $a_1$ transfer the content of the assembler page array is transferred into the PN page array. At the $a_2$ transfer, the content of the PN page array is transferred into the packer page array. Control means P.4, responsive to the content of register P.1.3a, through bus P.31, transmits the words of the page to output buffer such as P.9, to the input of the memory, and to registers of said memory control means M.9. Preferred embodiments of said means are described in Part 4.

PART 3—THE LANGUAGE

3.1 General Outline

A primary feature of this invention is the fact that the computer hardware assumes the configurations of the abstract machines (the FSMs defined in Section 1.3) conceived by the user as models of the desired processes. In other words, there is no difference between the structure and the actual operation of the computer and those of the virtual machine implied in the source program. Due to this fact, the complex compiler programs used in the prior art are unnecessary here.

Therefore, before proceeding to the details of the functional blocks indicated in Part 2, it is appropriate to become acquainted with the details of the abstract machines designed by the user. These abstract machines are described by means of a language; we call these descriptions the source programs, and this language the user language. Then, these descriptions, expressed in a suitable form, are given to the CPL system in order for it to implement the conceived FSMs; we call the FSMs in this suitable form the object program, and the suitable form the machine language. The elements of both languages correspond to the elements constituting the FMSs: states, input data $u_r$, prescription $I_J$ of input data, variables $x_r$, functions $F_J$ on the variables, transition functions $T_J$ and routing $R_J$ of the data. These elements are common for both said source and object programs. However, the form in which they are expressed for the user and for the computer will be different; and this is the only difference between the user and the machine language.

In our preferred embodiment of the language for the user, a mixture of graphic means and alphanumeric notations is used. The states are indicated with domains encircled by a line, FIG. 13; the transitions between states are indicated by arrows and special symbols in the space between the states; the variables $x_r$ by names starting with a capital, and they have a prime if they are in the page array B.12; the input data $u_r$ by names all in lower case; the functions F by means of conventional mathematical notations and coded words in capitals; the functions T for the transitions are indicated with the conventional symbols =, >, ≦ when it is appropriate, and by decision tables when they are complex; the routings R are indicated with coded symbols located in specific places; and the input prescriptions are implicit in the description of functions F and T.

Figure 14:
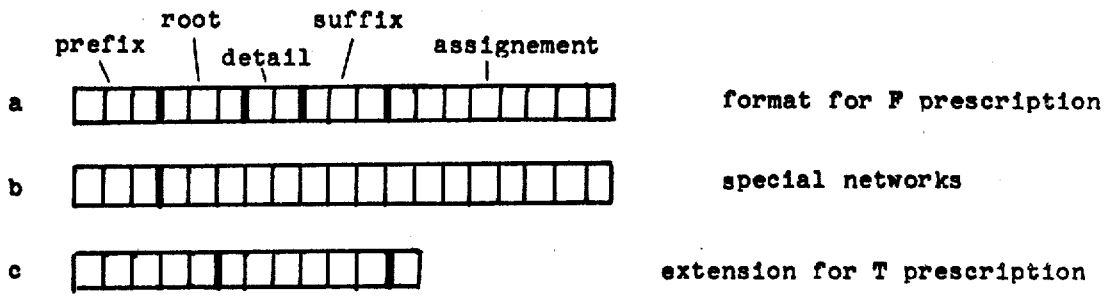
FIG. 14 are preferred word formats for the machine language.

In the preferred embodiment of the machine language, binary words inflected similarly to spoken languages are used. FIG. 14 shows preferred formats; the format itself, the grammar to be applied, and the meaning vary with the type of function, as will be apparent in the course of the specification. In this way, a large amount of information can be conveyed by single words of manageable length.

Due to the direct correspondence between elements of the source and object programs, we imply in this specification, for the sake of simplicity, that the user is writing and loading the coded binary words. Obviously, all the prior art techniques of memnonic codes, interpreters and automatic loading can be advantageously used, as appropriate. In the following sections, the user language and the machine codes for the various elements of the FSMs are given in the form of grammar rules and tables for an exemplifying machine with eight variables $x_r$ and eight input data $u_r$. It is to be understood, however, that a variety of different choices and forms can be used, for various applications and different complexities of the computer, based on the same methods.

3.2 Description of Function F

In the present invention, functions F are implemented by networks. When we think of a network, we look at it as a parallel array, if there is a regularity of repeated characteristics; we look at it as composed of a main element and collateral parts, if all operations relate to a single variable; we look at it serially, one part at a time, if the network is composed of a distributed set of elements performing different, dependent or independent, functions; and we think of it as a unit, without entering into details, if we are already familiar with what it does. According to these natural ways of thinking, four preferred modes of prescribing networks are disclosed.

Mode 1—Collective prescription (an assignment of a similar function to several variables $x_r$).

Figure 13:
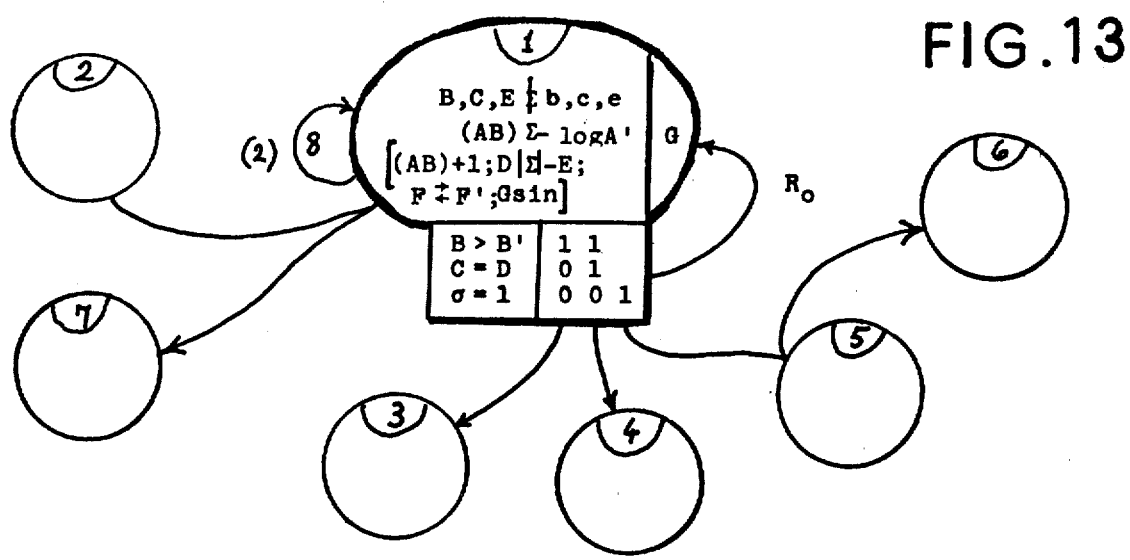
FIG. 13 is an example of the graphic means of the user language.

In the user language, this prescription is made by listing the names of the variables involved, followed by the symbol of the operation, and by the arguments in an order corresponding to that of the variables; the first line in state 1 of FIG. 13 is an example.

In the machine language, prefix 0 of Table 1 is used for this mode. This table shows that format "a" of FIG. 14 should be used, and Tables 2, 3, 4 and 7 for the root, detail, suffix and assignment, respectively. For said example in state 1 of FIG. 13, root 1 of Table 2, detail 2.2 of Table 3, suffix 0 of Table 4, and rule 1 of Table 7 lead to the following $W_F$ word

| 000 | 001 | 01 | 000 | 01101000 |
|---|---|---|---|---|
| prefix | root | detail | suffix | assignment |

In the machine language, this prescription implies that an input prescription (Section 3.5) assigns the desired input variables $u_r$ to the input registers. The example reported means that the variables B, C and E are accumulating in a circular way and the input data b, c and e, respectively. From the prescription in machine language, we see that B, C and E have been assigned to the machine words $x_2$, $x_3$ and $x_5$, respectively.

Root 7 of Table 2 refers to operations that do not have an argument, thus, in this case, the specifications of Table 4 are not necessary, and Table 5 is used instead, which specifies the particular operation.

Mode 2—Individual prescription (functions relating to a selected variable).

Because the assignment of the variables of the problem to the words $x_r$ of the machine is arbitrary, the selected variables can be chosen at the time of the design of the machine, with resulting simplification of the programmable network. For simplicity of description, we imply here that the selected variables are one, starting from word $x_1$.

In this exemplifying embodiment, the variable can have the length of several machine words, and a variety of functions that were not described in Mode 1. In the user language, the length of the variable is indicated in parenthesis after the name, or the several names (if each word was previously called by a name) are enclosed with parentheses; the second line in state 1 of FIG. 13 is an example; it means that the variable (AB), composed of sections $x_1$ and $x_2$, the latter of which was just incremented by b (previous line in state 1), is now decremented by the logarithm of the value A' which is in the auxiliary page array B.12.

In the machine language, prefix 1 of Table 1 is used. Then, root 2 of Table 2, detail 32 of Table 3, suffix 7 of Table 5, and rule 2 of Table 7 lead to the $W_F$ word

| 001 | 010 | 01 | 101 | 01010001 |
|---|---|---|---|---|
| prefix | root | detail | suffix | assignment |

When in Table 7 the content of the second part is zero, the argument is the previous value of the variable itself. The argument can be chosen to be of different lengths as indicated by the last part of the assignment.

Mode 3—Multiple prescription (different functions assigned to different variables).

The description of each function for each variable is made as in Modes 1 and 2, and an indication is added signifying that the functions are executed as a single network. In the preferred user language, this indication is a square parenthesis enclosing the entire prescription, as exemplified in the third and fourth lines of state 1 of FIG. 13. In the machine language, it is indicated by prefix 2 and 3 of Table 1. The last example means that (AB) is incremented by one, D sums the absolute value of the difference between D and E, F is interchanged with F', and G is substituted with its sine value. The corresponding machine prescription, through Tables 1, 2, 3, 4, 5 and 6, is determined as

```
011 111 00 001 01000000

010 010 11 001 00010000

010 000 11 011 00000100

010 111 00 110 00000010
```

These four operations are independent and can be executed simultaneously; accordingly, the preferred embodiment of PN (as will be described in detail in Part 4) allows the simultaneous execution of those prescriptions without conflicts.

Mode 4—Special Functions (that were developed for specific recurrent tasks).

In the use of a computer, often a group of operations are used and repeated in many recurrent jobs. It is thus desirable for the simplicity of the programs, or for the speed of the execution, to have that group of functions executed by means of a single specialized network. But these networks cannot be known at the time of the design of the machine. It is a feature of this invention to allow the user the addition of these special networks to the machine language.

As an example, let us consider the group of functions of the last example. After the functions are successfully tested in the form used in state 1 of FIG. 13, the same prescription is written in a state that also contains function 3 of Table 8. After one run of this state, a word is permanently stored in the machine, a word that implements a special network executing these functions. From that time on, that network is called by a $W_F$ word that was used in the word 3 of Table 8. All such numbers are then constituting a customer table of special networks. A part of these new $W_F$ words can be reserved for controlling some details also in these special networks, such as different options for different applications.

Control functions

In our embodiment, words $W_F$ are used not only for implementing operational networks, but also for certain control functions, which will be apparent in the course of the disclosure and of which one was explained above. In the preferred user language, these functions are indicated with memnonic words all in capitals, and in the machine language with prefix 5 of Table 1, and the codes of Table 8.

3.3 Description of Function T

Function T comprises branches to the next states and a function by which one of the branches is selected, in accordance with specified events, i.e., a decision function. Computers of prior art implement a decision by means of a sequence of steps that is an increasing function of the complexity of the decision. It is a feature of the present invention to provide the decision in one step, regardless of the number of variables involved and the complexity of the decision function, by means of specific network configurations. It is a further feature of this invention to provide the means for a wealth of transition functions by which complex processes can be modeled in the form of concise FSMs. The preferred functions are as follows, and indicated in FIG. 15 in the user language, and prescribed in the machine language as indicated at prefix 6 of Table 1.

(a) No prescription of any sort for T means that the FSM remains in the present state (until some action from the outside of that FSM occurs). In the state diagram, this case is represented by the absence of any arrow emerging from the circle representing that state, FIG. 15 (a). Similarly, no code is in the machine language.

(b) Unconditional transition to the state with the next label (in the natural numerical order). No state labels need to be indicated. The adopted graphical representation consists of drawing adjacent the circles representing the states, FIG. 15 (b). In the machine language, this function T consists of a simple coded word with the meaning "NEXT," (Table 9).

(c) Unconditional transition to state h. In the user language is represented by an arrow pointing to state h, FIG. 15 (c). (Each specific example in FIG. 15 is shown in heavier lines.) In the machine language, it is described by a code=0, followed by the state label h.

(d) Transition to different states depending on decisions. If the decision consists of a simple comparison, it is written in conventional notations and the origin of the arrow to be followed in the case that the indicated relation is true has a dot, FIG. 15 (d). If the decision is complex, the form of a decision table is used, FIG. 13, where a 1 stands for condition true, a 0 for condition false, and $\phi$ or no indication stands for don't care. The arrows start from the columns to which they relate; an arrow from the corner refers to the branching taken in the case that no one of the indicated column is true, i.e., the condition "else." No indication is necessary if the else is to the present state.

In the machine language, the comparisons are described by codes in accordance with Tables 9, 10, 11 and 7.2 in the same order in which they appear in the decision table; the state labels corresponding to the arrows follow into extension words as shown in Table 11. The T function of FIG. 13 is written as

```
110 010 00 000 0...  /  00001 0010001  /  000000001000
110 010 10 011 0...  /  00011 1001010
110 011 01 001 0...  /  00100 1010010
110 100 00 000 0...  /  00101 0000100  /  00110 0000000
_____/     _____/    _____/
      codes                extensions         extensions
```

(e) Driven transition. An FSM, whatsoever the transition function in its present state, is driven into a state specified by a variable $x$, or by another FSM. This transition is indicated in the state diagram of the driven FSM by a dashed arrow, FIG. 15 (e). It is prescribed as one of the control operations described in Table 8, in the FSM that orders the transition. A dashed arrow is used also for the starting state.

(f) Stay in the present state n cycle, then the other prescriptions will act. The user representation consists of an arrow looping into the same state with the value n written inside, FIG. 15 (f). In the machine language, it consists of a code with the meaning "STAY," the label of the present state an auxiliary bit, and the number n.

(g) Stay in the present no cycles, except if a specified transition occurs. The user representation is as in (f) with the addition of a number in parenthesis indicating the position of the branch that has priority, being the branches listed in an order. In the example of FIG. 13, the branch to state 4, which is in position 2 from left to right, has priority over the staying 8 times in state 1. In the machine language, the position number of the priority transition is added in the word of the state label, in the priority locations (Table 11).

(h) Go to state h and stay there for n cycles (then the transition described in state h will act). The user representation consists of an arrow with open head where the value n is written, FIG. 15 (h). In the machine language, it is described by a code=0, the state label h, a special bit and the value n.

(i) Go to state h stopping over states k, m, . . . (stopover transition). The graphical representation consists of a jagged arrow with notches pointing to the states where stop is made, FIG. 15 (i). In the machine language, this prescription is made with a code=0 and the sequence of state labels.

(j) As in i, but staying in the states for assigned numbers of times. The graphical representation is as in i, with the number of cycles written in the notches, FIG. 15 (j). In the machine language, the numbers of cycles are added to the state labels preceded by the special bit.

(k) Lock of page. This feature is used when the page movement is controlled by function T, rather than following the automatic circulation. The graphical representation consists of a circle added to the branch, FIG. 15 (k). The machine prescription consists of a code added to the state labels for which the page remains in PN (Table 11).

(l) End of page. This transition produces the disappearing of the page. It is represented graphically by a triangle, FIG. 15 (l). In the machine language, is described as a selected state label.

(1) State related routing

The routing is executed every time an FSM is in the state in which this routing is prescribed. The routing of variable G in state 1 of FIG. 13 is an example.

(2) Transition related routing

The routing is executed only when the FSM goes through a specified transition. In the user language, this is indicated by writing the routing prescription at the side of the selected transition, as shown in FIG. 13; in the machine language, by prescribing the loading of the routing words, as will be apparent in Section 4.4.

(3) Driven routing

It occurs in an FSM, say FSM 1, when prescribed by another FSM, say FSM 2. This routing is not described in FSM1, but in FSM2 as an F function (see Table 8). It is suggested to indicate this routing also in the state diagram of FSM1, in parenthesis, for the convenience of the user.

3.5 Description of Input Prescription 1

Two types of inputs are considered; quantities (numbers, codes or symbols) that are written in the program; and quantities that come from the input lines $\xi_1 \ldots \xi_h$, in a static, or stream mode.

No explicit input prescription is necessary in the user language (the state diagram). The input quantities appear in the expressions of function F, as names if they come from input lines, or as numbers or symbols if they are written in the program.

TABLE 1

PREFIX

| Number | specification | format | prefix machine code | root | detail | suffix | assignment |
|---|---|---|---|---|---|---|---|
| 0 | function F, collective | a | 0 0 0 | 2 | 3 | 4 or 5 | 7.1 |
| 1 | function F, individual | a | 0 0 1 | 2 | 3 | 5 or 6 | 7.2 |
| 2 | jointed F collective | a | 0 1 0 | 2 | 3 | 5 | 7.1 |
| 3 | jointed F individual | a | 0 1 1 | 2 | 3 | 5 or 6 | 7.2 |
| 4 | coded networks | b | 1 0 0 | customer table | | | |
| 5 | control functions | a | 1 0 1 | 8 | 3.6 | see Table 8 | |
| 6 | function T | a,c | 1 1 0 | 9 | 10 | 4 | 7.2 |

(Table 11 for extensions)

3.4 Description of Routing R

It is a feature of this invention to provide means for routing any variable $x_r$, at any cycle of the process, to any output device available. Moreover, the routing function provides the possibility of changing the position of the variables in the page, of modifying the quadruplets of its own or other FSMs, and of prescribing specific organizations for the storage medium. Tables 12 and 13 show examples of different types of routing functions, with the preferred user notations and machine codes. The routings of Table 12 are prescribed collectively for several variables, with features of the language similar to those used for mode 1 in the prescription of F. The routings of Table 13 are prescribed individually, similarly to mode 2 of F prescription. Table 13 has also control functions.

Three ways of prescribing routing are used in our preferred embodiment.

TABLE 2

ROOT

| number | function | user symbol | root machine code | detail | suffix |
|---|---|---|---|---|---|
| 0 | transfer | see 3.1 | 0 0 0 | 3.1 | 4 |
| 1 | summation | Σ | 0 0 1 | 3.2 | 4 |
| 2 | subtraction | Σ— | 0 1 0 | 3.3 | 4 |
| 3 | multiplication | X | 0 1 1 | 3.2 | 4 |
| 4 | division | : | 1 0 0 | 3.4 | 4 |
| 5 | shift left | X | 1 0 1 | 3.5 | # shift |
| 6 | shift right | : | 1 1 0 | 3.5 | # shift |
| 7 | unary functions | see 5 | 1 1 1 | see 5 | 5 |

TABLE 4

SUFFIX

| number | argument specification | suffix machine code |
|---|---|---|
| 0 | $X_r = F(u_r)$ | 0 0 0 |
| 1 | $X_r = F(X_{r+1})$ | 0 0 1 |
| 2 | $X_r = F(X_{r+2})$ | 0 1 0 |
| 3 | $X_r = F(X'_r)$ | 0 1 1 |

TABLE 4-continued

SUFFIX

| number | argument specification | suffix machine code |
|---|---|---|
| 4 | $X_r = F(X'_{r+1})$ | 1 0 0 |
| 5 | $X'_r = F(u_r)$ | 1 0 1 |
| 6 | $X'_r = F(X_r)$ | 1 1 0 |
| 7 | $X'_r = F(X_{r+1})$ | 1 1 1 |

TABLE 3

DETAIL

| number | | specification | user symbol | machine code |
|---|---|---|---|---|
| 1 | 1. | variable $x_r$ copies $x_q$ | $X_r = X_q$ | 0 0 |
|   | 2. | variable $X_r$ becomes $X_q$ and $X_q$ becomes = 0 | $X_r \leftarrow X_q$ | 0 1 |
|   | 3. | interchange of values between $X_r$ and $X_q$ | $X_r \rightleftarrows X_q$ | 1 1 |
| 2 | 1. | when the variable overflows it assumes the max value | Σ | φ 0 |
|   | 2. | free overflow (circular) | Σ | φ 1 |
|   | 3. | each variable works independently | A,BΣ | 0 φ |
|   | 4. | adjacent variables are cascaded | (AB)Σ | 1 φ |
| 3 | 1. | the variable assumes negative values | Σ— | 0 0 |
|   | 2. | variables become = 0 when they would be negative | Σ | 0 1 |
|   | 3. | free overflow | Σ | 1 0 |
|   | 4. | difference of the absolute value | Σ | 1 1 |
| 4 | 1. | the remainder is disregarded | : | 0 0 |
|   | 2. | the remainder is substituted to the quotient | : | 0 1 |
| 5 | 1. | it introduces zeros | : | φ 0 |
|   | 2. | circular | : | φ 1 |
|   | 3. | each variable independent | X,X: | 0 φ |
|   | 4. | adjacent variables are cascaded | (XX): | 1 φ |
| 6 | 1. | next page only | | 0 0 |
|   | 2. | the following pages until a change of FSM | | 0 1 |
|   | 3. | one page after an FSM change | | 1 0 |
|   | 4. | the pages between the first and the second FSM change | | 1 1 |

TABLE 5

SUFFIX

| number | function | user symbol | machine code | detail (*) |
|---|---|---|---|---|
| 0 | reset to zero | $X_o$ | 0 0 0 | 0 0 |
| 1 | set to maximum | max | 0 0 0 | 0 1 |
| 2 | complement | $\overline{X}$ | 0 0 0 | 1 1 |
| 3 | increment by one | +1 | 0 0 1 | 3.2 |
| 4 | decrease by one | −1 | 0 1 0 | 3.3 |
| 5 | square | sq | 0 1 1 | 3.2 |
| 6 | square root | √ | 1 0 0 | 3.4 |
| 7 | log value | log | 1 0 1 | 0 0 |
| 8 | antilog value | log$^{-1}$ | 1 0 1 | 0 1 |
| 9 | sine value | sin | 1 1 0 | 0 0 |
| 10 | cosine value | cos | 1 1 0 | 0 1 |
| 11 | reset to zero $X'_r$ | $X'_o$ | 0 0 0 | 1 0 |

(*) to be used only with root 111

TABLE 6

SUFFIX

| number | function | user symbol | machine code | detail |
|---|---|---|---|---|
| 0 | logic AND | AND | 0 0 1 | 0 0 |
| 1 | logic OR | OR | 0 0 1 | 0 1 |
| 3 | exclusive OR | ⊕ | 0 0 1 | 1 0 |
| 4 | bit reversal | BR | 0 1 0 | |
| 5 | special function 1 | name | 0 1 1 | |
| 6 | special function 2 | name | 1 0 0 | |

TABLE 7

ASSIGNMENT

| number | specification |
|---|---|
| 1 | each variable is indicated by a bit in the position order of the variables |
| 2 | - first bit = 0, use suffix of Table 5<br>- first bit = 1, use suffix of Table 6<br>- second and third bits: number of words forming the variable<br>- fourth and fifth bits:<br>  0 0   input variable<br>  0 1   next variable<br>  1 0   auxiliary variable<br>  1 1   special combinations of arguments<br>- following three bits: the argument in the standard order<br><br>special combinations<br>  0 0 0   $u_1$ and $u_2$<br>  0 0 1   $u_1$, $u_2$ and $u_3$<br>  0 1 0   $u_1$, $u_2$, $u_3$ and $u_4$ |

TABLE 8

ROOT

| number | control function | detail | suffix | assignment |
|---|---|---|---|---|
| 0 | driven function T | 3.6 | $X_r$ label* | state label* |
| 1 | driven routing R | 3.6 | see Tables 12 and 13 | |
| 2 | driven input prescription I | 3.6 | $X_r$ label | code |
| 3 | write in EAROM | | | number |

*exclusive

TABLE 9

ROOT (T functions)

| number | specification | machine code | detail | suffix | assignment |
|---|---|---|---|---|---|
| 1 | NEXT | 0 0 1 | 0 0 | 0 0 0 | 0 ... 0 |
| 2 | STAY | 0 1 0 | 0 0 | 0 0 0 | 0 ... 0 |
| 3 | overflow | 0 1 1 | | | |
| 4 | control signal | 1 0 0 | | | |
| 9 | $X_r$ label in a decision | | T.10 | 4 | 0 ... 0 |
| 10 | " | | T.10 | 0 | 7.2 |
| 11 | " | | 0 1 | 0 | value |

TABLE 10

DETAIL

| number | specification | machine code |
|---|---|---|
| 1 | first variable = second variable | 0 1 |
| 2 | first variable > second variable | 1 0 |
| 3 | first variable < second variable | 1 1 |
| | illegal | 0 0 |

TABLE 11

EXTENSION WORDS first five bits = state label three pairs of bits for other-transition priority (p part)

TABLE 11-continued

| EXTENSION WORDS | |
|---|---|
| 0 0 = don't care | 1 0 = condition true |
| 0 10 = condition true | 1 1 = special information |
| last bit = auxiliary bit for following n (stay) | |

TABLE 12

ROUTING

| number | specification | code | assignment |
|---|---|---|---|
| 1 | clear | 0 0 0 1 | 7.1 |
| 2 | to output buffer | 0 0 1 0 | 7.1 |
| 3 | output buffer and clear | 0 0 1 1 | 7.1 |
| 4 | shift words to left | 0 1 0 0 | 7.1 |
| 5 | shift words to right | 0 1 0 1 | 7.1 |
| 6 | rotate words to left | 0 1 1 0 | 7.1 |
| 7 | rotate words to right | 0 1 1 1 | 7.1 |

TABLE 13

ROUTING

| number | specification | code | assignment |
|---|---|---|---|
| 1 | reserve memory segment | 1 0 0 0 0 | length |
| 2 | create a page | 1 0 0 0 1 | FSM and state |
| 3 | write $X_r$ at location $X_q$ | 1 0 0 1 0 | $X_r$, $X_q$ labels |
| 4 | read in $X_r$ the content at location $X_q$ | 1 0 0 1 1 | $X_r$, $X_q$ labels |
| 5 | interchange $X_r$ with content at location $X_q$ | 1 0 1 0 0 | $X_r$, $X_q$ labels |
| 6 | accumulate $X_r$ into location $X_q$ | 1 0 1 0 1 | $X_r$, $X_q$ labels |
| 7 | put at location $X_q$ the maximum value of $X_r$ and that content | 1 0 1 1 0 | $X_r$, $X_q$ labels |
| 8 | distance $X_r$ | 1 0 1 1 1 | $X_r$ |
| 9 | $X_r$ to input prescription for $X_q$ | 1 1 0 0 0 | $X_r$, $X_q$ labels |
| 10 | given input prescription for $X_q$ | 1 1 0 0 1 | prescr., $X_q$ lab. |
| 11 | order a record | 1 1 0 1 0 | |

In the machine language, an explicit prescription of words $W_I$, corresponding in a given sequence to the input registers, is necessary; in each word, a selected bit is 0 if the quantity is written in the program, is 1 if the quantity comes from an input line; the remaining part of the word is a binary representation of the quantity, in the first case, and a code selecting a particular input line, in the second case.

PART 4—PREFERRED EMBODIMENT

In this part of the specification, preferred embodiments of the elements used in the description of the invention (Part 2) are given. It is to be understood, however, that these embodiments are given as examples of how to make use of the invention, they are relative to the technology used, and are not intended to define the limits of the invention, which is set forth by the specifications, drawings and claims.

4.1 Decoder of the Programmable Network

Figure 5:
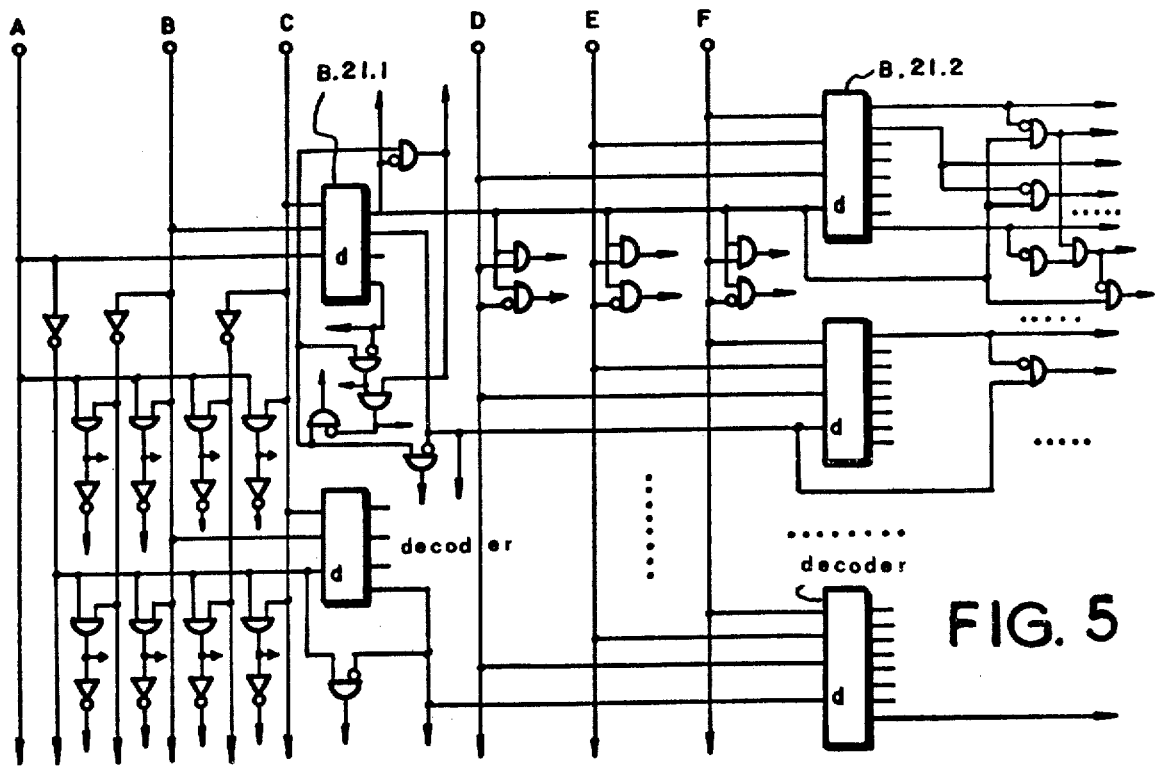
FIG. 5 is an embodiment of the decoder, part of the programmable network.

In one preferred embodiment, FIG. 5, lines A, B and C carry the bits of one part of the word (say the prefix), and D, E and F the bits of another part (say the root). Blocks, such as the B.21.1, are standard decoders 4 out of 2 with disabling input d; blocks, such as B.21.1, are decoders 8 out of 3 with disabling input. Each line terminated with an arrow represents a control line for the programmable network. Each bit can control directly some characteristics of PN (direct arrowed lines) and contribute to the semantics of the other groups of bits (through the decoders such as B.21.1 and B.21.2). Bit A divides the configurations into two main categories, bits B and C subdivide each of said categories into four sub-categories, bits D, E and F subdivide each said sub-category into eight groups, and so forth. Bit A acts as a prefix for the following bits, bits B and C act as a second prefix for the word indicated by D, E and F, etc. With the six bits shown in FIG. 5, the theoretical control functions would be $2^{26} = 2.6 \cdot 10^{19}$; the structure of FIG. 5 gives 334 control functions (the total number of arrows) that follow a "grammer" that is easy to acquire. Moreover, with additional logic circuits a large number of additional particular controls can be implemented.

Figure 16:
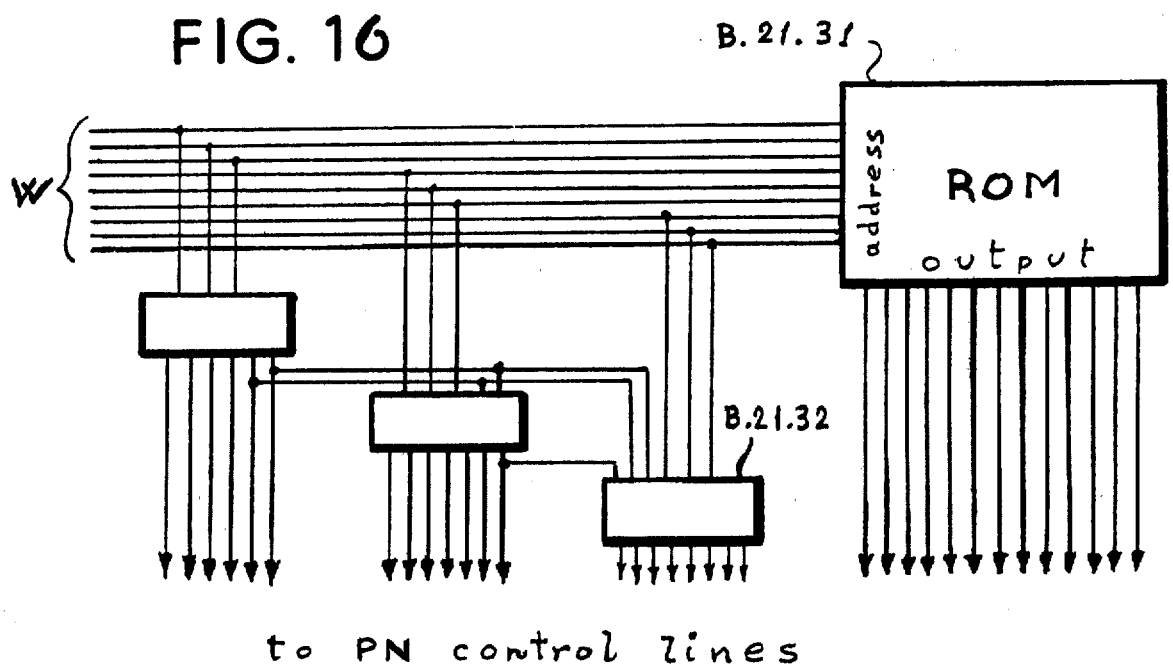
FIG. 16 relates to an embodiment of the decoder of the programmable network.

In a second preferred embodiment, FIG. 16, Read-Only-Memories, such as B.21.3 are used. Also, here each bit controls directly some characteristics of PN, and affects the semantics of the other bits by means of the interconnections between the Read-Only-Memories.

Figure 17:
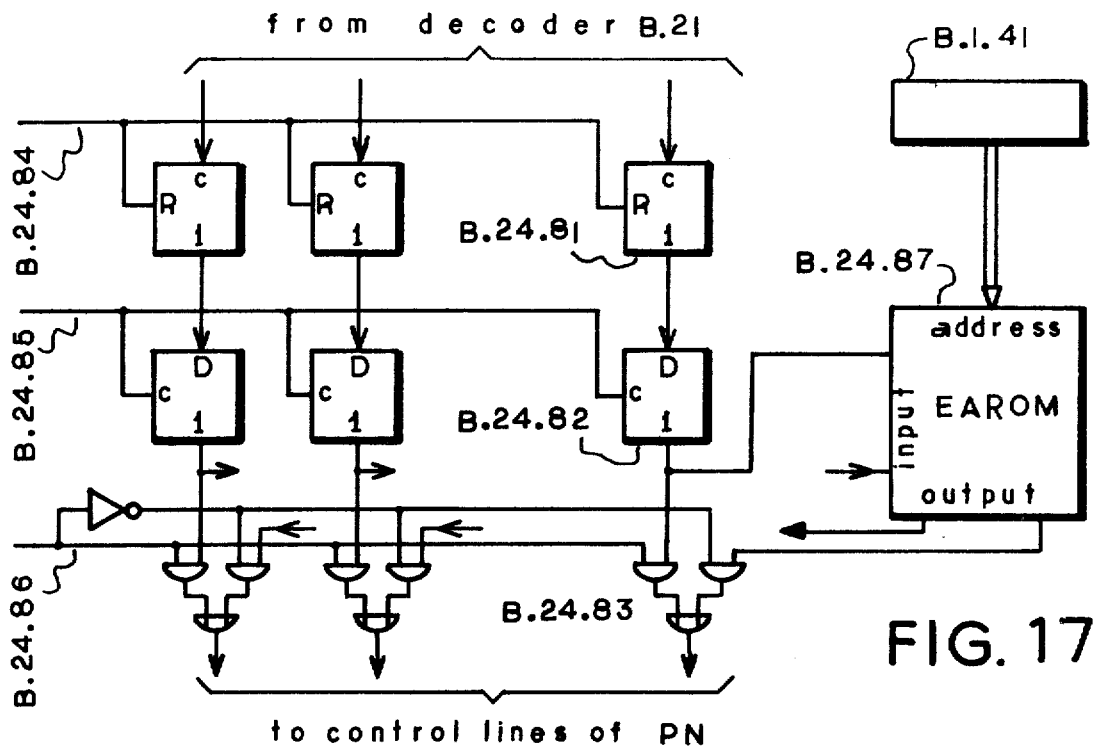
FIG. 17 shows means for the acquisition of new special networks in the machine language.

For the implementation of the "multiple prescriptions" (Mode 3 in Section 3.2), the decoder outputs (the arrowed lines in FIGS. 5 and 16) are connected to the clock inputs of an array of flip-flops, such as B.24.81 in FIG. 17. The outputs of a corresponding array of flip-flops, such as B.24.82, are connected to the controlling lines of the programmable network, through gates such as B.24.83. Normally, before the reading of each $W_F$ word, all the flip-flops are reset by a signal in line B.24.84, then, some flip-flops are set because of signals in output lines of the decoder; at the time in which the configuration of PN should be activated, a signal in the clock line B.24.85 produces the transfer of the content in the B.24.81s into the B.24.82s. When several words $W_F$ refer to the same PN configuration, the reset signal in line B.24.84 is suspended between these $W_F$s; thus, at the time of the signal in B.24.85, flip-flops B.24.82 will contain the accumulation of the prescriptions of said several words $W_F$.

For the implementation of the "special functions" decoder B.21, in response to the prefix 4 (Table 1) in register B.1.41, activates line B.24.86 in FIG. 17; in this way, the control lines of the programmable network are connected to the output of a memory B.24.87. The address lines of said memory are connected to the assignment part of the word $W_F$ in B.1.41, thus producing the desired selection of a special network description stored in the memory. For implementing the acquisition of new special networks in the machine language, memory B.24.87 is an Electrically-Alterable-Read-Only-Memory (EAROM). When code 3 of Table 8 appears in register B.1.41, the process is stopped, and the content in flip-flops B.24.82s, whose outputs are connected also to the input of memory B.24.87, is frozen. Then the writing procedure of the EAROM is initiated; such procedures are specific for each type of EAROM, and are described by the EAROM manufacturers.

4.2 Operating Elements of the Programmable Network

Figure 6:
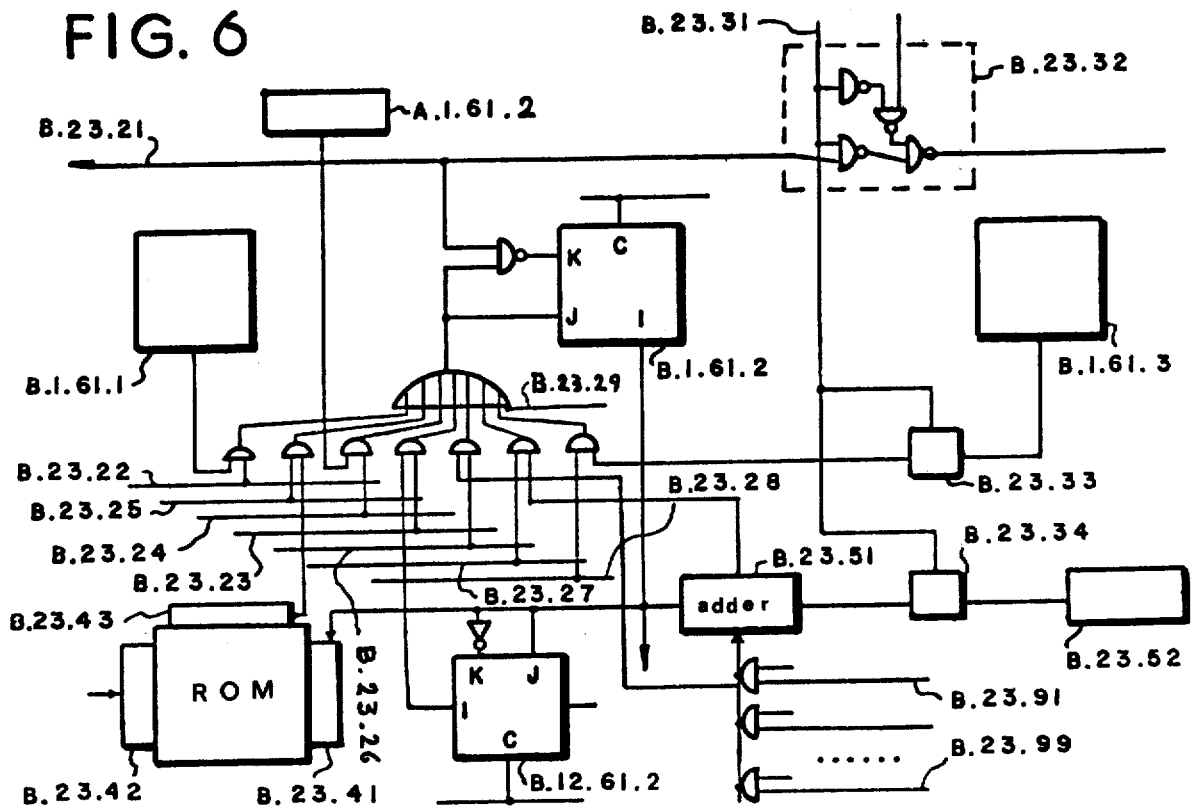
FIG. 6 is an embodiment of an operating element, part of the programmable network.

The preferred embodiment of B.23 is shown in FIG. 6. Each stage of register B.1.61 is composed of a J K flip-flop, such as B.1.61.2 controlled by a plurality of gates for performing different functions, every time a clock pulse is applied. Some controls are listed as examples: line B.23.21, when activated, produces the complement of the data stored in the flip-flop; line B.23.22 enables the shift of data to the right; line B.23.23 enables the exchange of data between registers B.1.61 and B.12.61; line B.23.24 allows the transfer from register A.1.61 to B.1.61 for implementing the page transfer $a_1$ (FIG. 2); line B.23.25 enables fast operations by means of Read-Only-Memories (acting as look up tables) selected by means of the multiplexer B.23.43 and selectors B.23.41 and B.23.42; line B.23.27 enables the addition and subtraction of the data that is presented to the input of the adder B.23.51 (among the inputs are links B.23.91 and B.23.99 indicated in FIG. 4); line B.23.28 enables the shift of data to the left.

A large number of similar stages are staked together to handle the longest word that may be used. But the chain of stages can be broken at several places by controls such as B.23.31, to form several independent operating elements that can be connected in specialized ways for particular operations. Boxes B.23.33 and B.23.34 are circuits similar to the B.23.32 for enabling of interrupting the cascading.

Examples of operations

Figure 11:
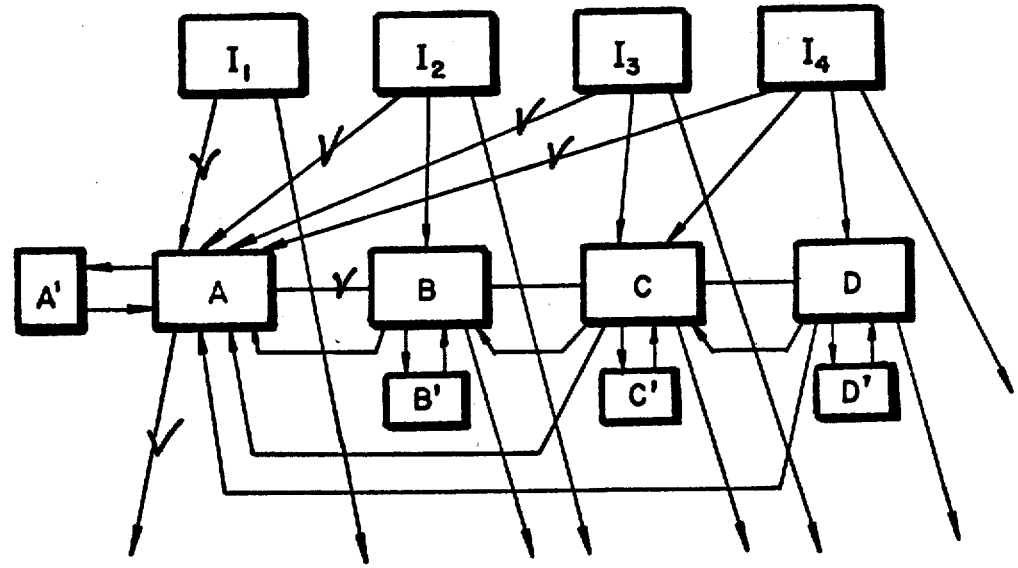
FIG. 11 shows connections between variables in the programmable network.

In a minimal implementation of PN, four groups of stages such as that in FIG. 6 are used and called variables A, B, C and D. The connections, such as B.23.91 in FIG. 6, for these variables are as in FIG. 11, and are controlled by bit 9, 10 and 11 of the $W_F$ words in accordance with Table 4.

The transfer of data (root 0 of Table 2) is obtained activating line B.23.26 of FIG. 6. The clearing of the argument (detail 12 in Table 3) is obtained by sending a clock pulse to the flip-flops of the argument, simultaneously, with all gate controls at zero. The interchange (detail 13 in Table 3) is produced activating the reciprocal connections, and sending a clock pulse to the flip-flops of both variables.

The operations in the variables of B.12 are obtained first interchanging B.1 with B.12, then producing the operations as the variables were of B.1, finally interchanging again B.1 with B.12.

The summation in saturation mode (detail 2.1) is obtained by connecting the overflow signal from element B.23.34 to line B.23.29; in this way all the flip-flops of the variables go to 1. The circular summation is obtained by blocking the cascading element B.23.24. The absolute value of the difference (detail 34) is obtained with the following control sequence, in reference to adder B.23.51, element B.23.34, and lines B.23.21 and B.23.29 of FIG. 6:

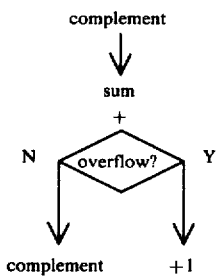

4.3 Decision Element of the Programmable Network

In a decision there are two phases: the first produces logic values as a function of the variables, such as comparison, presence of a given condition, etc., and the second operates a logic function on these logic values.

Figure 7:
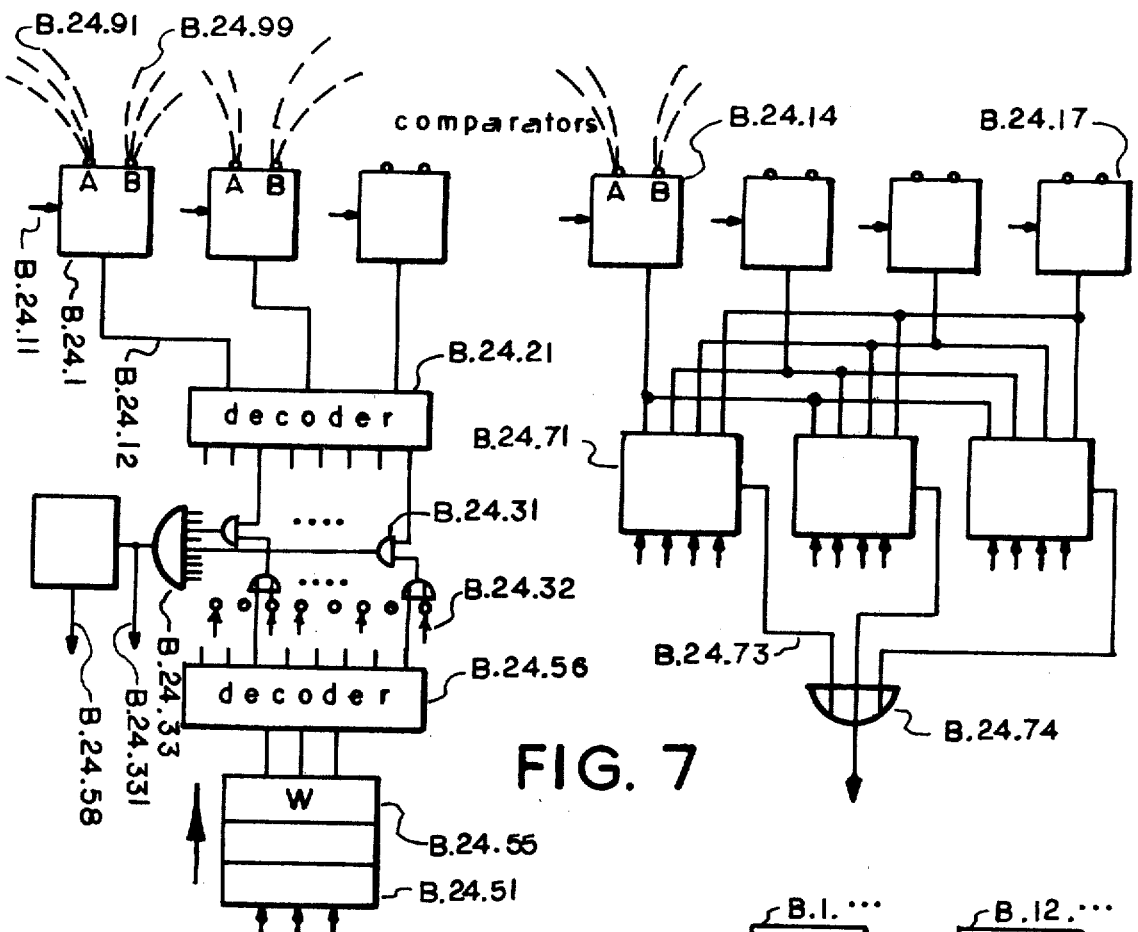
FIG. 7 is an embodiment of a decision circuit, part of the programmable network.

The first phase is produced by comparators such as B.24.1, FIG. 7. At the input A and B of the comparators, links are converging from the data registers, such as B.24.91 and B.24.99 mentioned in FIG. 4; one pair of links at a time is activated by decoder B.21. Each comparator produces a logic 1 at the output line, such as B.24.12, when the two numbers presented at the inputs A and B are equal or one is larger than the other, depending on the value of a program bit presented at the line B.24.11. Therefore, four conditions can be known about the input numbers $=, \neq, >, \leq$.

The outputs of these comparators are the inputs of decoders, such as the B.24.21, for the wanted logic function. As an example, B.24.21 is an 8 out of 3 decoder, the outputs of which go to NAND gates, such as B.24.31, the second input of which comes from $W_T$ bits at points such as B.24.32. All the outputs of these gates are ORed by gate B.24.33. The output B.24.331 of that gate produces the wanted function of the three inputs of the decoder B.24.21. If n are the inputs, $2^N$ are the outputs of the decoder (each one corresponding to a logic product of the inputs); they are selected by the $2^N$ bits of $W_T$, giving the corresponding sum of products, making all the $2^{2^H}$ functions of the N inputs possible.

If the generality of the functions is not needed and fewer bits in $W_T$ are desirable, the following variation is preferred: if N are the input lines of decoder B.24.21, groups of N bits of $W_T$ are presented to register B.24.51. Each group of bits shifts up to register B.24.55 and, by means of decoder B.24.56, opens one of the gates such as B.24.31 (corresponding to one logic product). One or several $W_T$ words can be used each time, depending on the type of function desired, flip-flop B.24.57 stores the information that an output occurred from the gates; therefore, the output of the function will be available at line B.24.58.

A further embodiment preferred when functions of few logic products are needed, is as follows. A series of said comparators B.24.14 . . . B.24.17 produce binary signals from pairs of input numbers. These signals go to the inputs of digital comparators, such as B.24.71. At the other input of the comparators, $W_T$ bits are presented. Each comparator produces an output 1 in the output line, such as B.24.73, when the two input words are identical. Gates B.24.74 ORes the outputs of all the comparators and produces the wanted function. Functions can be obtained of as many logic products as comparators are in the circuit.

With a well known technique, comparators B.24.11 . . . B.24.17 can be implemented by the adders such as B.23.51 of FIG. 6, with related connections such as B.23.91. Table 10 refers to such an implementation.

4.4 Means for the Transition Function

Figure 18:
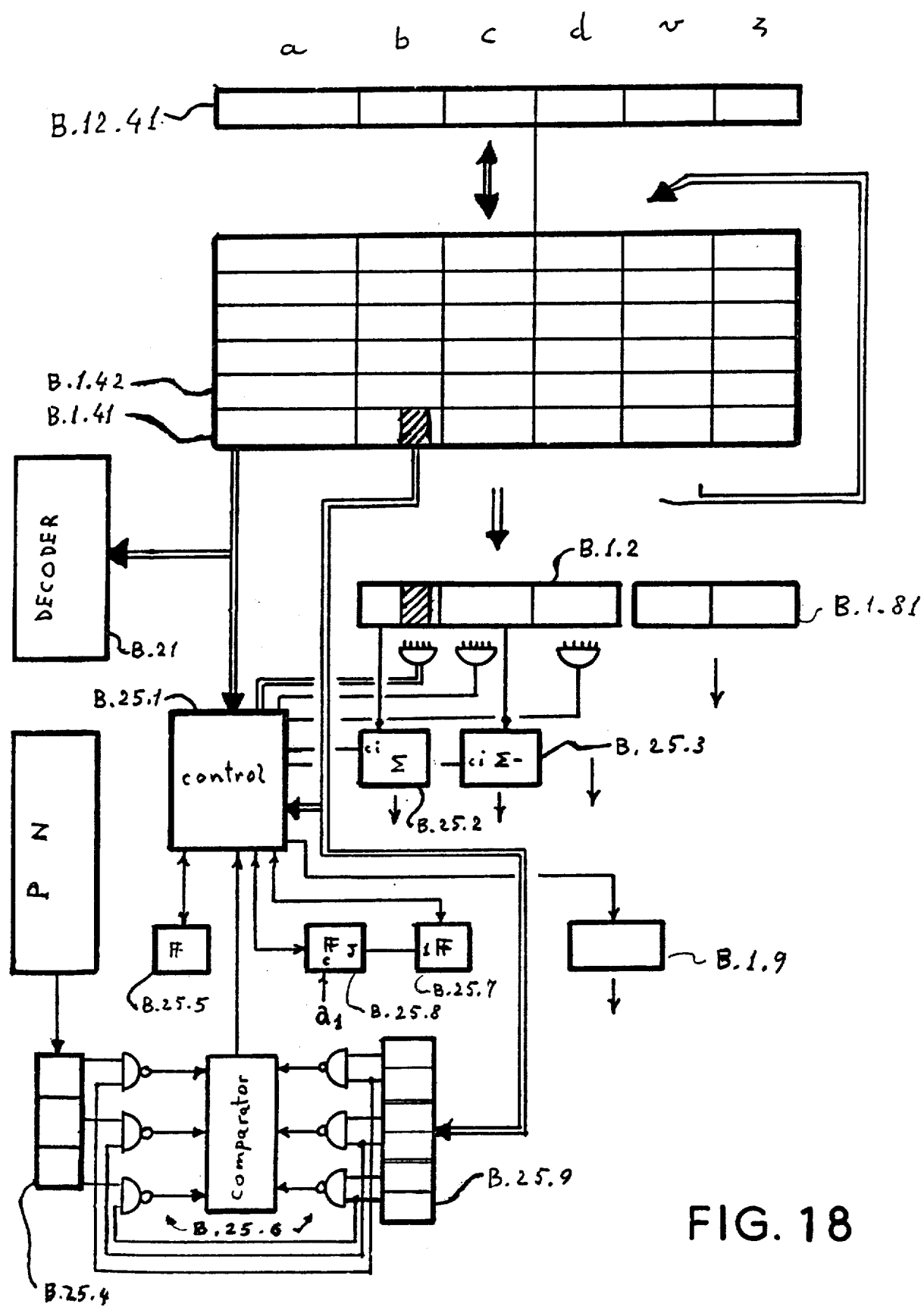
FIG. 18 shows means for the execution of the transition functions.

FIG. 18 shows details of the programmable network (FIG. 4) relevant to the transition function. Registers B.1.41, B.1.42 . . . are repeated, subdivided in sections a, b, c . . . ; register B.1.2 is repeated, subdivided in similar sections b, c, d . . . ; B.1.81 is a storage register holding routing prescriptions for the packer; B.1.9 is a storage register for holding information for the packer; B.25.2 and B.25.3 are an adder and subtractor, respectively, connected between B.1.2 and the corresponding register of the packer page-array. The connections that carry several bits in parallel are indicated with the heavy lines. Moreover, B.25.1 is a control circuit that has a combinational part functionally described in TABLE 14, and a sequential part functionally described in the flow chart of FIG. 19.

At the completion of Function F, registers B.1.41, B.1.42 . . . contain words $W_T$ describing the function T, and B.1.2 still holds the initial key word of the present page. B.21 preselects the decoding functions related to the $W_T$ words (Section 4.3) and starts the operation of B.25.1. The execution of the transition functions listed in Section 3.3 is described below in reference to FIG. 19, and Table 14. It is understood that the extension words of $W_T$ are loaded in sections b, c, d, . . . of registers B.1.41, B.1.42 . . . .

(a) Responsive to zero content in B.1.41, B.1.2c and B.1.2d, control B.25.1 remains inactive (see Table 14). Thus, register B.1.2b, which received the label of the present state from register A.1.2 at the transfer $a_1$, will keep its content; therefore, the same present state will be transferred into register P.1.2 of the packer, at the transfer $a_2$.

TABLE 14

|        |         | content in register B.1.2 | | | | |
|--------|---------|-------|---------|-------|-------|-------|
|        |         | auxiliary bit = 0 | | auxiliary bit = 1 = | | |
|        |         |       |         | C = 0 |       | C = 0 |
| B.1.41a | B.1.41b | C = 0 | C ≠ 0   | D = 0 | C ≠ 0 | D ≠ 0 |
| 0      | 0       | —     | β       | —     | γ     | δ     |
| NEXT   | φ       | α     | α       | α     | γ α   | α     |
| 0      | ≠0      | S1    | β       | S1    | γ     | δ     |
| code   | φ       | S2    | β       | S2    | γ     | δ     |
| STAY   | 0       | S1, M | β       | +     | γ     | δ     |
| STAY   | p ≠ 0   | N, S2 | N, S2   | +     | N, S2 | N, S2 |
|        |         | S1, M | β       |       | γ     | δ     |

— = inactive
α = +1 in B.25.2
β = 1 in B.1.9
γ = −1 in B.25.3
δ = 2 in B.1.9
S1 = start sequence at S1
S2 = start sequence at S2
M = set p = 1 in B.1.2
N = store p into B.25.9
+ = skip B.1.41 if p = 1s (b) Control B.25.1, responsive to a selected code (with the meaning of "NEXT") in B.1.41a, activates the carry-in of adder B.25.2; thus, at the transfer $a_2$, the key word will carry the old state label incremented by one.

(c) Responsive to zero content in B.1.41a and B.1.41b, the combinational circuit of B.25.1 (Table 14) starts the sequential behavior at the point S1 (FIG. 19); thus, B.1.2 receives the new state label.

Figure 19:
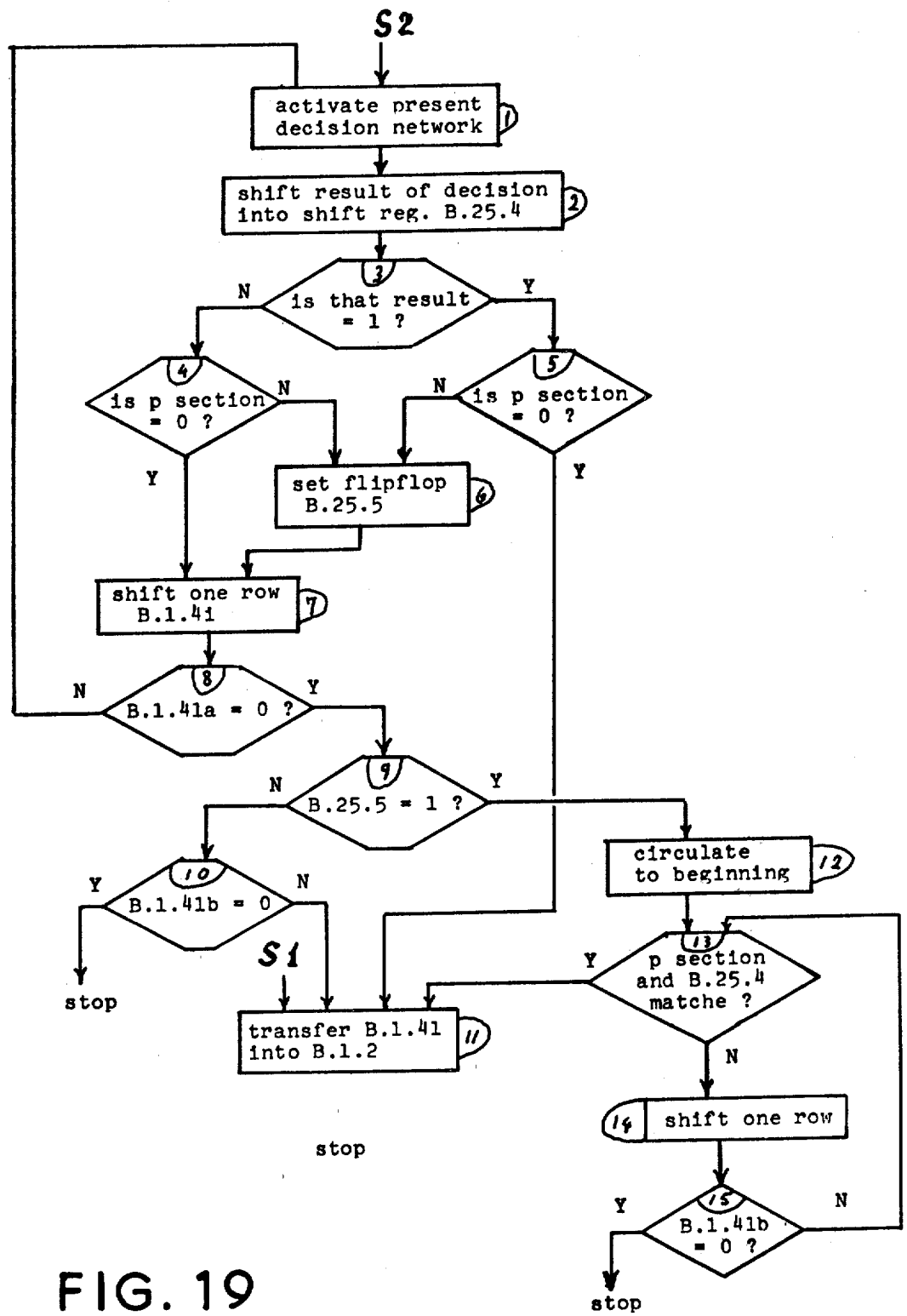
FIG. 19 shows the sequential behavior of the means of FIG. 18.

(d) In response to content in both B.1.41a and B.1.41b, control B.25.1 starts its sequential behavior at the point S2 (FIG. 19). The decision network described in B.1.41a is implemented in the programmable network, and the logic result (0 or 1) is stored in the first cell of the shift register B.25.4. If the result is 1, and no decision table is involved (tests 3 and 5 of FIG. 19), the content of B.1.41 is transferred into B.1.2 (step 11 of FIG. 19). If the result of the decision was 0, and it was the only decision network, the state label that was in B.1.42 is transferred into B.1.2 (steps 3, 4, 7, 8, 9, 10, 11 in FIG. 19). If no state label was in B.1.42b (test 10 in FIG. 19), B.1.2 keeps the present state. If there are several decision networks prescribed, they are implemented in succession, until the last (test 8).

If a decision table is involved, flip-flop B.25.5 is set (step 6). After having implemented all the decision networks, if B.25.5 is set, the content of registers B.1.4i are recirculated to their initial position (step 12); then the content of the section p of B.1.41b is continuously compared (register B.25.9 is kept transparent) with the content of shift register B.25.4 through gates B.25.6. When a matching is found, the content of B.1.41 is transferred into B.1.2 (steps 13 and 11). If no matching is found, the present stage is left in B.1.2 (step 15).

(e) When code 0 of Table 8 appears in B.1.41a (at the time of function F), a configuration of PN transfers the variables $x_r$ into register B.12.41b, and flip-flop B.25.8 is set. When B.25.8 is set, control B.25.1 transfers the content of B.12.41 (which is in the auxiliary page-array B.12, FIG. 2) into B.1.41 at the function T time. At the next page transfer, the transferring signal $a_1$ reset B.25.8.

When detail 6.2 (Table 3) appears in B.1.41a, a variable $x_r$ is transferred into B.1.49, and flip-flop B.25.7 is set instead of B.25.8; the latter is set by $a_1$ at the next page transfer, thus the transition in B.1.49 affects the following pages.

When the assignment of code 0 in Table 8 is different from zero, its content is transferred into B.12.41b instead of the content of some variable $x_r$. The subsequent steps are as previously described.

(f) When code STAY in B.1.41a is read by B.25.1, the content of B.1.41 is transferred into B.1.2 and section p of B.1.2b is set to all 1s (Table 14). The following times, the special bit in B.1.2 will be found =1, and B.1.2c≠0; accordingly, B.25.1 activates −1 in the subtractor B.25.3; the new key word will have the number of time n decreased by 1. When B.1.2c will be found =0, and p is all 1s in B.1.2 (which means that the prescription STAY in B.1.41a should not be repeated), the content in B.1.41 is shifted away (not recirculated), and the following transition functions are implemented.

(g) If B.1.41a contains the code STAY and section p of B.1.41b is ≠0, the content of the latter is transferred and hooked into register B.25.9, and the sequential behavior of B.25.1 is started at point S2. If a matching is found, a new content is transferred into B.1.2, as described in (d). Otherwise, B.25.1 proceeds as described in (f).

(h) The first time, the content of B.1.41 is transferred into B.1.2. The following times, the special bit is =1 and B.1.2c is ≠0 because it contains n. Responsive to these conditions, control B.25.1 activates the carry-in of subtractor B.25.3; thus, at the transfer $a_2$, the key word will carry n (the number of times) decreased by one. When B.1.2c is =0, the content of B.1.41 dictates the actions, thus, the transitions prescribed in the present state will act.

(i) Responsive to the conditions B.1.2c≠0 and special bit in B.1.2=0, B.25.1 (Table 14) produces a number 1 into register B.1.9. The control means of P.4 of the packer (FIG. 8), when reading said 1 in P.1.9 will skip the first section of the key word in P.1.2, thus, the key word that is stored into the memory will contain the state label that was originally in B.1.41c.

Note that prescription NEXT in the present state has priority on stopover transitions; this is purposely chosen to allow the running through of a series of adjacent states, with a single stopover. Also here, content in section p of B.1.41b starts the sequential behavior as indicated in (g) for determining a priority transition.

(j) Responsive to the conditions B.1.2c≠0, and special bit=1, B.25.1 activates the −1 in the subtractor B.25.3, thus the new key word will have the "number of times" decreased by one. When B.1.2c becomes=0, but B.1.2d is ≠0 (which means that there is a further stopover), a number 2 is transferred into B.1.9. At a later time, the packer will skip two sections of the key word, leading to the state label that was originally in B.1.2d.

(k) When the code "locked" (Table 11) is found in section p of B.1.2 by means B.21, only the routing prescriptions are transferred to the packer at the $\alpha_2$ time, and then timer B.22 is restarted without the transferring $\alpha_1$ of a new page.

(l) A selected state label signifies that the page should disappear. Control B.25 proceeds in the ways previously described; however, when that state label is detected by the control means P.5 of the packer, the routing, if prescribed, is executed, but the page is not transferred into the memory.

4.5 Means for the Routing

When the routing prescriptions are state related (Section 3.4 (1)), they are loaded by the assembler into register A.1.3a, FIG. 3; the corresponding register B.1.3a in the programmable network, FIG. 4, remain idle. When the routing prescriptions are transition related (Section 3.4 (2)), they are loaded into sections of registers A.1.41, A.1.42..., in correspondence to the words that specify the related branches of the transition function; the corresponding registers in PN perform the shifting described in Section 4.4 for determining the next state label, and when the content of B.1.41b... is transferred into B.1.2, FIG. 18, the content of B.1.41$v,z$ is transferred into B.1.81. When the routing prescription is driven (Section 3.4 (3)), they will be first transferred into sections of register B.12.41, FIG. 18, similarly as for the driven transitions, then into register B.1.81.

Figure 20:
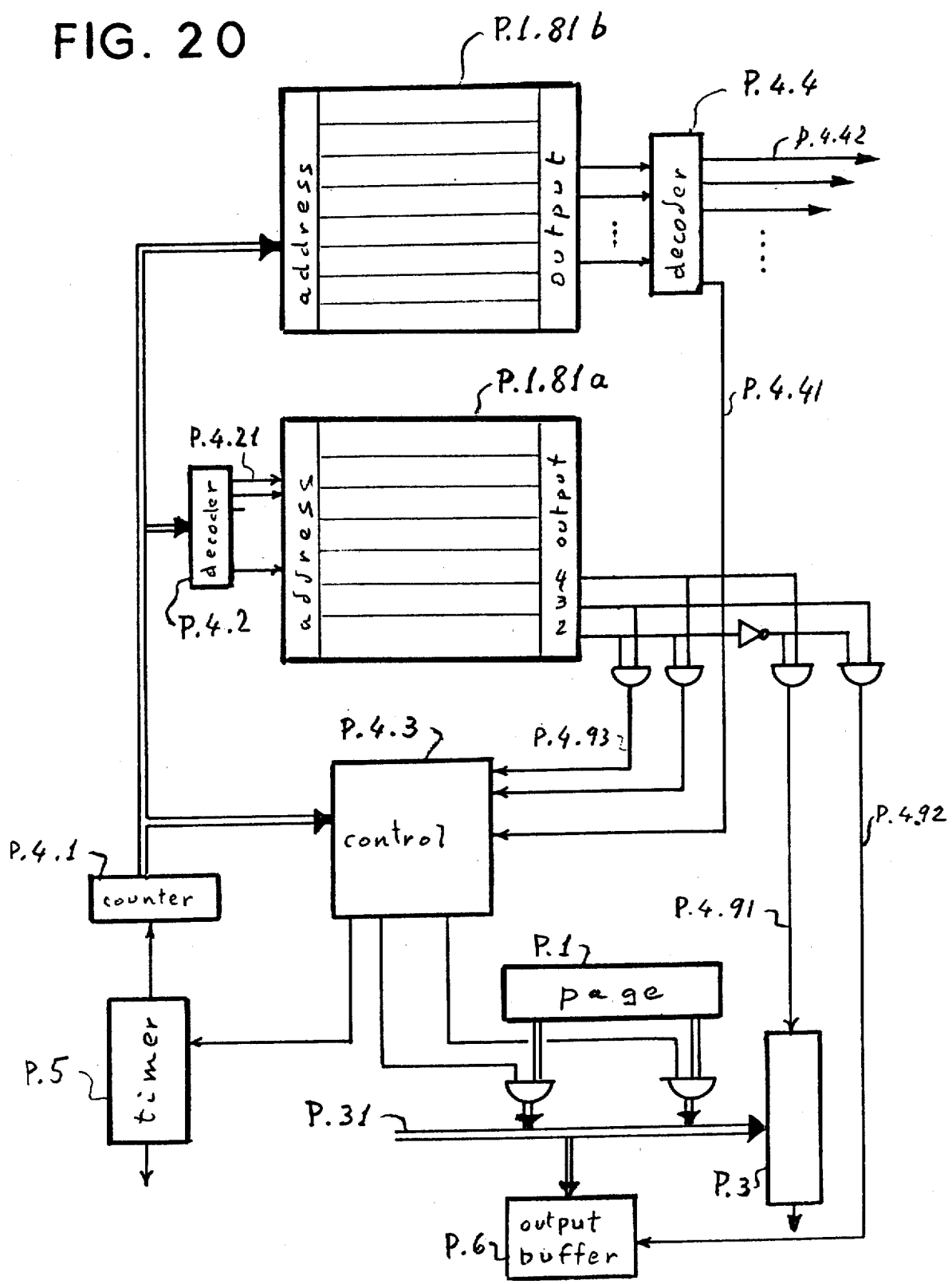
FIG. 20 shows means for routing functions.

At the page transfer $\alpha_2$, the routing words in B.1.81 and B.1.3a are transferred in parallel into the content addressable memories P.1.81a and P.1.81b of the packer, FIG. 20, simultaneously. But P.1.81a clears all the words that have the first bit=0, and P.1.81b clears all those that have the bit=1 (See Table 13). In this way P.1.81a stores the routings assigned with a bit for each variable, and P.1.81b the routings assigned with the order number of the variable. P.1.81a is an associative memory with search operated by signals in lines such as P.4.21 corresponding to each bit of the assignment part of the routing words. P.1.81b is an associative memory with search based on the matching between the assignment numbers in the routing words and numbers presented at lines such as P.4.11. Counter P.4.1 receives a pulse from timer P.5 for every word transmitted to the memory; decoder P.4.2 decodes the content of the counter P.4.1. In this way, for each word ready to be sent from the page array P.1 into the memory, in the established sequence, the corresponding routing prescriptions are addressed in the memories P.1.81a and P.1.81b. The bits of these prescriptions, directly or by means of decoders, implement the actions listed in Table 12. As examples, bit 4 of P.1.81a, through P.4.91, resets register P.3, thus executing the clearing of that word; bit 3, through line P.4.92, enables the transfer from bus P.31 to an output buffer storage P.6; the same bits, when bit 2 has a logical value 1, alter the sequence of gating signals from means P.4.3, through lines such as P.4.93, for implementing shifting and rotation of the words. Means P.4.3 includes an adder for combining the number from counter P.4.1 and bits from lines such as P.4.93 and a decoder. The content read in memory P.1.81b produces, through decoder P.4.4, the transfer from bus P.31 to the proper registers in order to implement the variety of routings that are described in Table 13; line P.4.41 enables the transfer of a variable $x_v$ as an additional part of the key word for an input prescription, through a multiplexer in P.4.3; lines such as P.4.42 control the transfers to memory registers as will be described in Sections 4.7.3 and 4.7.4.

4.6 Means for Input Acquisition

Figure 21:
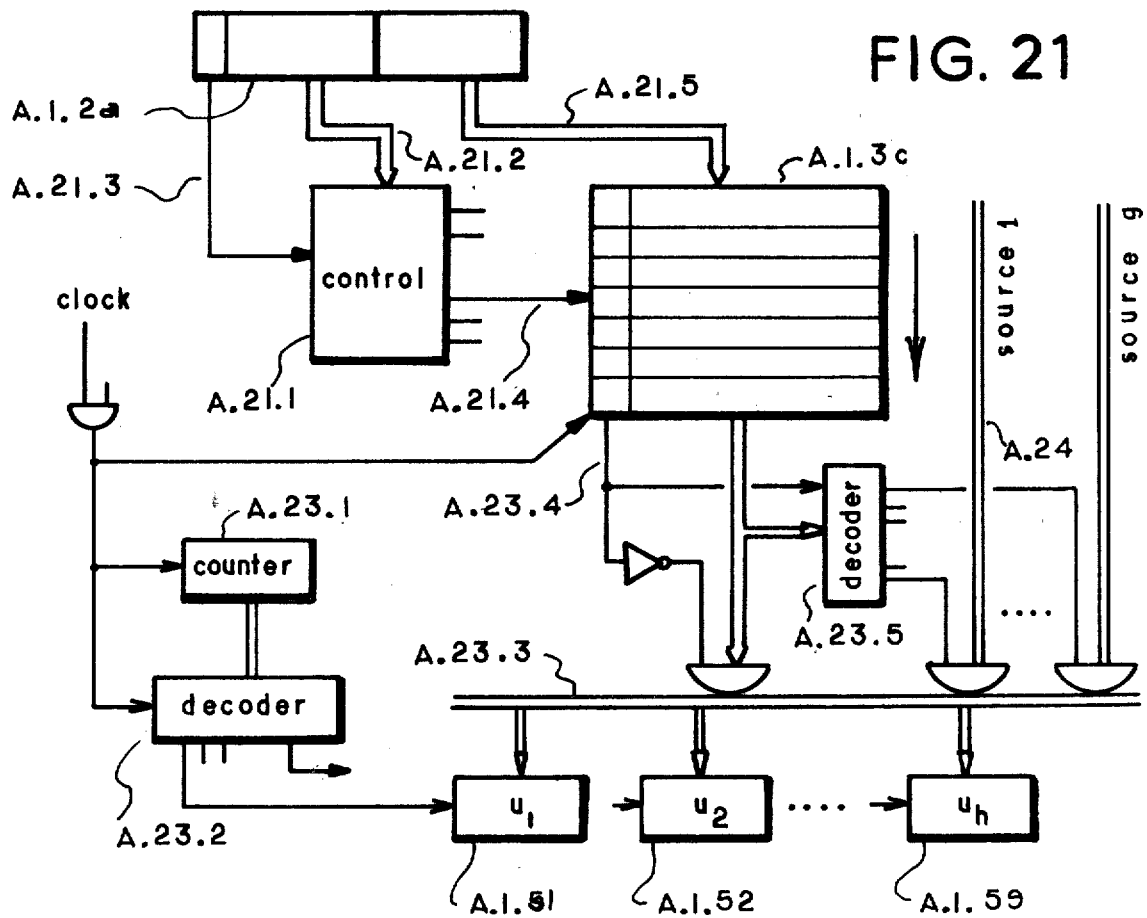
FIG. 21 shows means for input acquisition.

The general procedure for the acquisition of new data has been described in Sections 2.2 and 2.5 in reference with FIGS. 3 and 12. FIG. 21 shows the preferred embodiment of the features for the acquisition of new input data $u_r$. As soon as the assembler has completed the loading of the words $W_I$ of the present state into the set of registers A.1.3c, control means A.21.1, in response to content in register A.1.2a, sensed through lines A.21.2, and 0 in the first bit, sensed through line A.21.3 (which means input prescription in the key word), selects one register of A.1.3c, by means of lines such as A.21.4 (in accordance with the code 9 of Table 13) and transfers into it the content of the last part of A.1.2a through lines A.21.5. This content substitutes for the previous one that might have been given by a $W_I$.

Then clock pulses are sent to counter A.23.1 and to the shifting down in registers A.1.3c. For each pulse, the bus A.23.3 is connected to an input source; the source is registers A.1.3c itself, if the first bit of $W_I$ in line A.23.4 is 1; otherwise, the content of A.1.3c, through decoder A.23.5 selects an outside source, or a data register such as A.1.519. In correspondence with connections of the bus A.23.3 to different sources, decoder A.23.2 connects the input registers A.1.51 ... A.1.59 to the bus, one at a time, in the same order implied by the machine language.

Simultaneously, to said acquisition of new inputs $u_r$, control means A.22 (FIG. 3), similar to those indicated in FIG. 21, provide the selection and transfer of words $W_F$ and $W_T$ from registers A.1.411 ... into registers A.1.41..., responsive to the content of a set of registers A.1.3b.

4.7 Embodiment of the Memory

4.7.1 Propagation Medium

In a first preferred embodiment of the memory, a medium where waves can propagate is used, such as delay lines, wave guides and propagation spaces that form a closed transmission channel. In such a propagation medium, waves capable of transmitting at least three symbols are used; 0 and 1 for data, and A as auxiliary signal.

Figure 9:
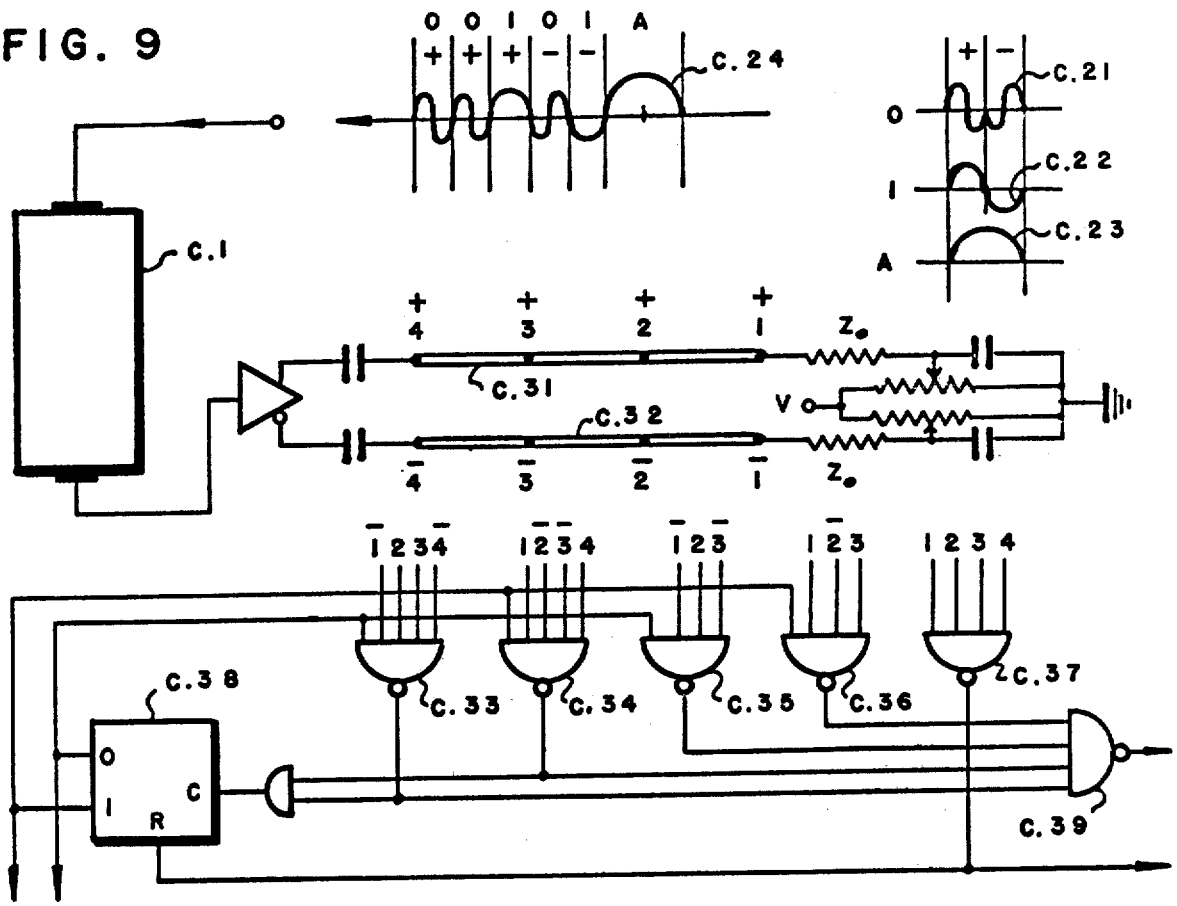
FIG. 9 relates to one embodiment of the memory.

As an example, in FIG. 9 a quartz delay line C.1 is used as storage medium; three orthogonal waveforms C.21, C.22, C.23, corresponding to the symbols 0, 1 and A, are sent to the transmitting transducer. For each symbol there are two waveforms of opposite polarity, indicated as + and −. In C.24 a sequence of symbols, in the form of a sequence of waveforms, is indicated. It can be noted that every time a symbol 1 (waveform C.22) occurs, the following waveforms have polarity opposite to that presented before.

At the receiving transducer the signal, after amplification, goes with opposite polarity into two matched delay lines C.31 and C.32, which have taps separated by a delay equal to a half period of the waveform at highset frequency, that for the 0 in our example. Digital gates C.33, C.34, C.35, C.36 and C.37, with the inputs connected to the taps of the delay lines as indicated by the numbers in the figure, detect the three waveforms on separate lines. For each symbol there are two gates with inverted inputs for matching the two opposite polarities the waveforms may have in a sequence. Every time a waveform 1 (C.22) occurs, and therefore an output is produced by the gate C.34 or C.33, flip-flop C.38 is complemented. The outputs of this flip-flop enable each one of two pairs of gates of opposite polarity at alternate times. The output of flip-flop C.38 also gives the information that waveforms 0 and 1 are present. The clock necessary to produce the single bits is recovered by gate C.39. Symbol A is given by gate C.37. The output of gate C.37 also resets flip-flop C.38 corresponding to the assumption that each word is started by one of the two polarities.

The buffer page array A.12, A.13, P.12 and P.13 in the assembler and packer, respectively, are acting as interface between the random duration of cycles in the programmable network, the random length of the pages and the constant rate of symbol transmission of the channel.

4.7.2 Sequential digital medium

In a second preferred embodiment of the memory, a medium capable of propagating digital signals is used, such as shift registers, magnetic-bubble devices, electric-charge devices, discs, drums, and magnetic tapes closed in a loop. In these media, a unit is a block of bits, FIG. 22. Some bits of the unit carry the data content and some represent an auxiliary signal. The preferred auxiliary signals and their meaning are:

1 1 = new page
1 0 = new section of the page
0 1 = new word
0 0 = continuation of a word The shifting of data from the packer and to the assembler goes in steps of said units; the bus emerging from P.3 and that connected to A.1 has as many lines as there are bits in the content part of the unit.

This type of storage medium permits the implementation of all the features of the first embodiment, and many of the features of the third embodiment to be described.

4.7.3 Addressable storage medium

In a third preferred embodiment of the memory, addressable devices are used, such as magnetic cores, integrated digital devices, etc. The storage is organized in memory words in which some bits are used as auxiliary signals, as described in the previous embodiment. Reading from and writing into the memory is performed in parallel for each word; the control means of the packer and assembler, responsive to the auxiliary signals, produce the transfer of words and pages of different length to and from the registers of the page arrays of the asembler and packer.

The addresses for the storage medium are produced in such a way as to write each incoming page into successive new memory words. The addresses increase circularly, thus reading and writing continue endlessly in a given region of the memory, permitting the pages to change in size and number. Moreover, the addresses are changed in such a way as to organize the entire storage as required by the data structures to be processed. One or several segments of the memory can be used to circulate pages as if they were independent channels; one or several other segments can act as a functional memory, as to be described later.

Figure 23:
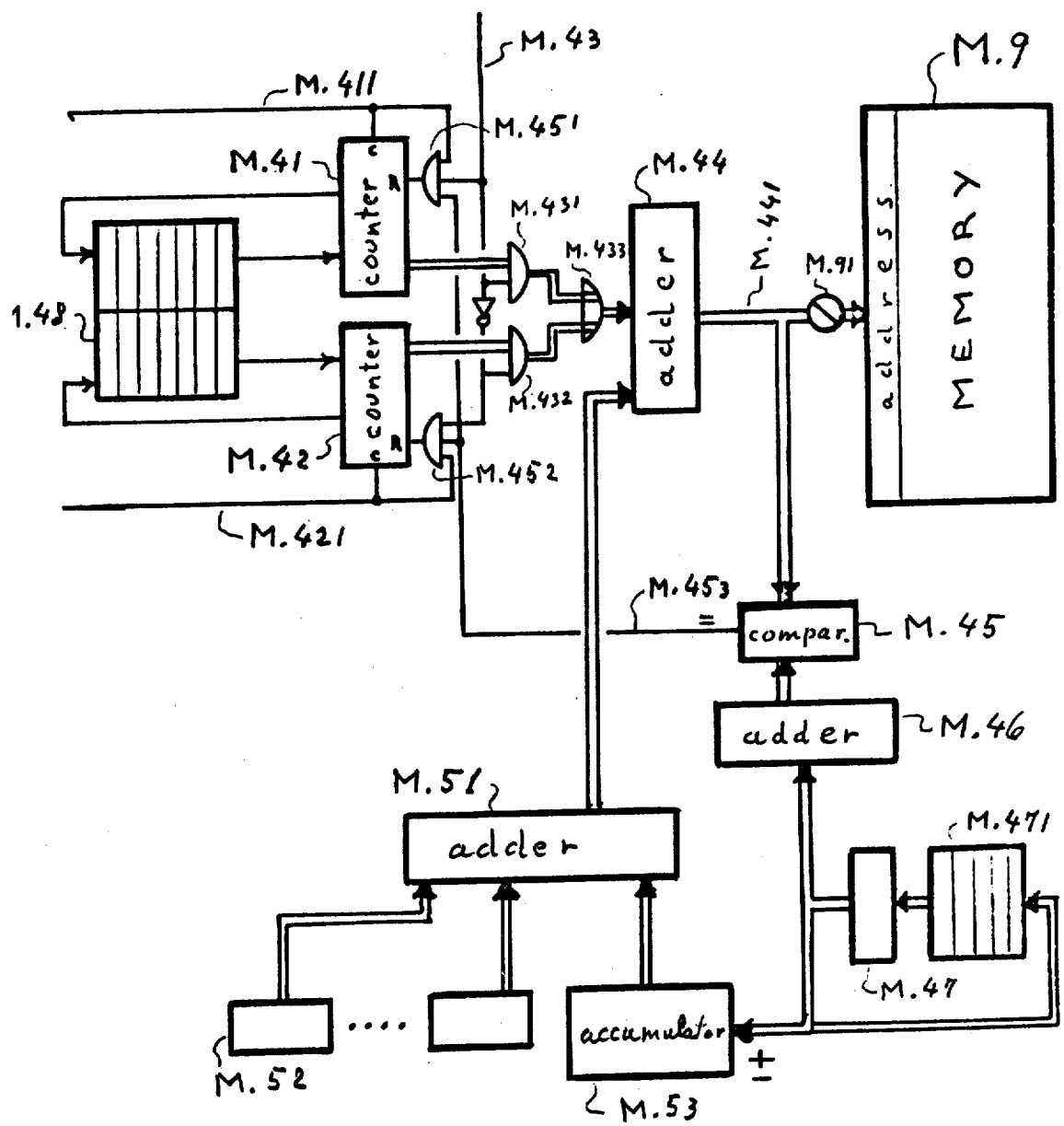
FIG. 23 shows means for the programmable segmentation of the memory, and the circulation of pages.

FIG. 23 shows the production of such addresses for an addressable storage M.9. Counter M.41 receives pulses from the control P.5 of the packer in order to increase by one for every word written into the memory. Counter M.42 increases by one for every word read from the memory by the assembler. Line M.43 is at level 1 or 0 depending on the packer being writing or the assembler being reading, respectively. Thus, the memory is addressed by counter M.41 during writing, and by counter M.42 during reading, through gates M.431, M.432, M.433 and the adder M.44 and the switch M.91.

The present memory address in the bus M.441 is compared in M.45 with a number from adder N.46 when equality occurs, either in reading or in writing, a signal in line M.453 through gates M.451 or M.452 reset to zero counter M.41 or M.42, respectively, at the next arriving pulse. In this way a segment of the storage is used in a circular way for a set of pages which can change in size and number, without conflicts in the memory, provided that the total number of words does not exceed the capacity of that segment. The size of this segment is given by the number stored in register M.47.

Said memory segment can be allocated anywhere in the memory region by the number produced by adder M.51. This number is the summation of the content of several registers such as M.52 and M.53. In an exemplifying application, M.52 is used to reserve a portion of the storage for functional memory, and M.53 for the starting point of a segment n. Different segments can be circulated in the memory by inserting different numbers into registers M.41, M.42, M.47 and M.53. For this purpose sets of shifting registers M.48 and M.471 are provided with means for circulating successions of numbers into M.41, M.42 and M.47; moreover, M.53 is provided with means for accumulating the number in M.47 every time a shift occurs in the loop of M.47 and M.471; the number in M.47 is subtracted from M.53 when the shifting reverses. Control means are provided to produce a given number of shifts, in one direction or in the other, responsive to routing words.

4.7.4 Functional memory

It has been shown in the previous sections how the circulation of the pages provides the variables $x_r$, at the proper times, to the registers of the programmable network, for the processing of several FSMs. It has been shown also how these variables can be enriched from outside, through input prescriptions, and how they can be routed outside. Further features are now described for the manipulation of data. In certain processes, sets of data have to be treated with regularity, following specific functions; in these cases, the memory is configurated accordingly and provided with circuits performing those functions. Examples of functions that often occur are: temporary storage of data to be used by several processes (random access storage); search for the maximum value in a set of data; frequency distribution of values in a set of data. We can see that in this invention, the random access of data is a particular function, to be used when it is a characteristic of the process to be executed. This is opposed to the procedure used in prior art, in which all the data have to be addressed because the memory has a single configuration—that of a random access storage.

Figure 24:
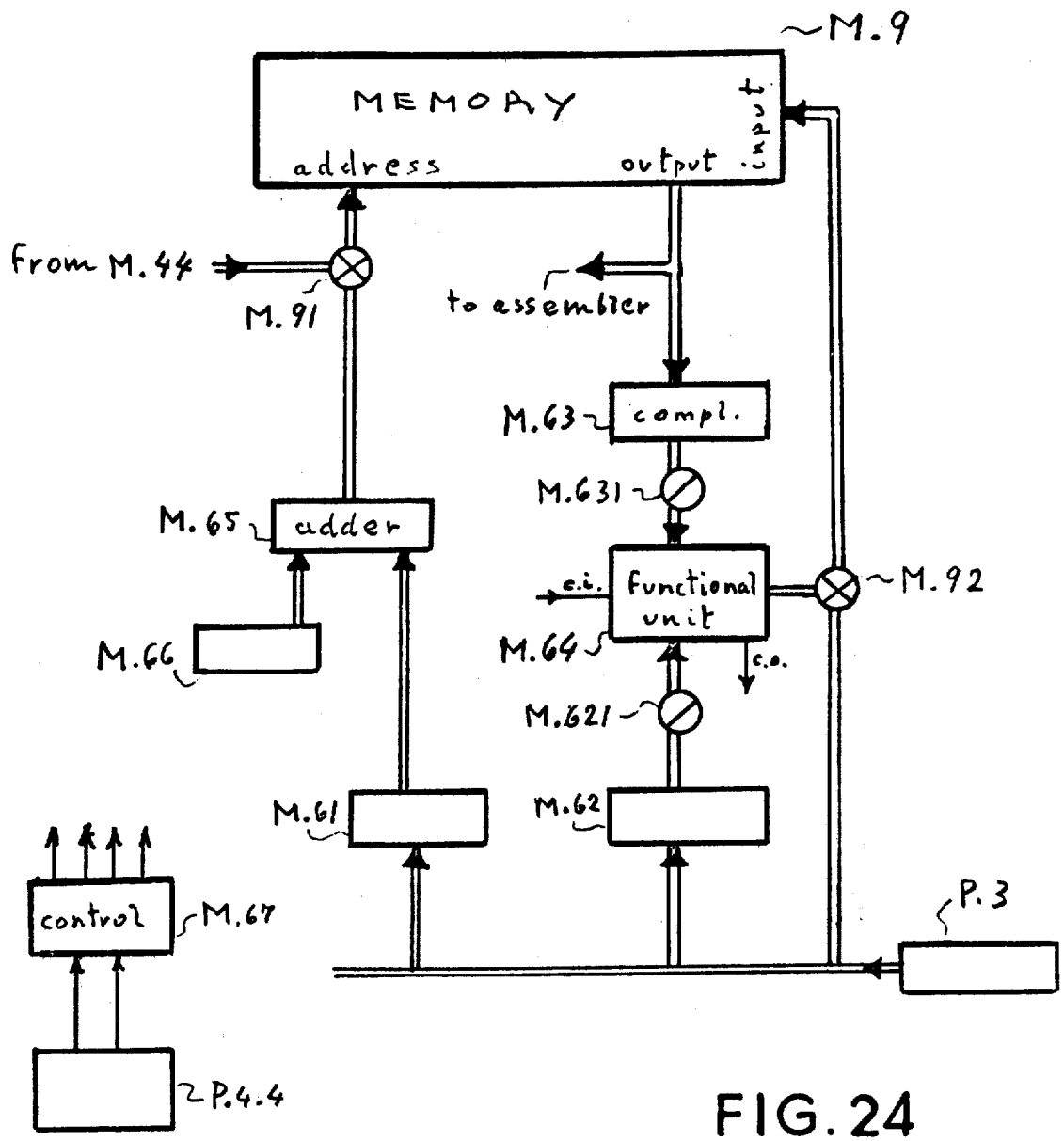
FIG. 24 shows means for the functional memory.

FIG. 24 shows a preferred embodiment for dynamically configurating parts of the memory, which we call functional memories, to perform the functions listed in the second part of Table 13. Memory M.9 has a switch M.91 to diverge its address lines from adder M.44 to adder M.65, a switch M.92 to diverge the input lines from register P.3 of the packer to adder M.64; moreover, the output of the memory is connected also to the input of register M.63. Adder M.64 has one input connected to register M.62 through switch M.621, the other input connected to register M.63 through switch M.631, and a carry input and carry output to be used as described below. Register M.63 has the capability of complementing its content. Adder M.65 has its two inputs connected to registers M.61 and M.66. These components are controlled by circuit M.67 as indicated in Table 15, responsive to signals from P.4.4. of the packer (FIG. 20).

For storing with random access, the variable to be stored is transferred from P.3 into M.62, and the addressing variable into M.61. For acquiring data with random access; first, the addressing variable is transferred into M.61 and the datum read into M.63; second, the content of M.63 is written into the page presently under packing into a memory segment. For the interchange in random access, the datum to be stored is transferred into M.62, and the addressing variable into M.61; the presently stored datum is read into M.63, then the content of M.62 is written into the presently addressed location of the memory; finally, the content of M.63 is written into the page presently under packing into a memory segment. For accumulating data with random access, the datum to be accumulated is transferred into M.62 and the addressing variable into M.61, the present value in the memory is read into M.63, and then written into the same location augmented by the content of M.62. For the distribution, the value to be distributed is transferred into M.61, the present value in the memory is read into M.63, and then re-written into the same location augmented by one. In the search for the maximum value, the present value is transferred into M.62 and the addressing variable into M.61, the value presently in the memory is read into M.63 and complemented; if a carry out is produced by adder M.64, the content of M.62 is written into the memory, otherwise the present value in the memory is left unchanged.

TABLE 15

| function | memory address M.91 | memory input M.92 | memory control | M.631 | M.621 | carry in of M.64 |
|---|---|---|---|---|---|---|
| circul. of pages | M.441 | P.3 | R/W | — | — | — |
| writing | M.65 | M.64 | W | open | closed | 0 |
| reading | M.65 | — | R | — | — | — |
|  | M.441 | M.64 | W | closed | open | 0 |
| interchange | M.65 | M.64 | R/W | open | closed | 0 |
|  | M.441 | M.64 | W | closed | open | 0 |
| accumulation | M.65 | M.64 | R/W | closed | closed | 0 |
| distribution | M.65 | M.64 | R/W | closed | open | 1 |
| maximum value | M.65 | M.64 | R/W | sequence | | |

4.7.5 The creation of pages

All the storage medium beyond the reserved segments (established by content in registers M.52 . . . M.53) is available for circulating pages. A page exists in the memory if in some location of said part of the storage medium there is an auxiliary signal 1 1 (Section 4.7.2 and FIG. 22).

A page is introduced from outside into the system by loading its key word into the assembler. New pages can be generated by an existing page through routing key words (routing 2 of Table 13). When memory P.1.81b (FIG. 20) of the packer contains a key word routing, the indicated variable is connected to bus P.31 instead of the key of the present page; then the key and data of the present page follow in the regular way.

In the memory, a new page contains only the key word; but as soon as the key is in the assembler, a function F is acquired, which will produce variables $x_r$ in PN; then the page will contain those variables also.

PART 5—PROGRAMMING

In the prior art, typically, the user prepares a sequence of statements in a high level language; then the sequence is transformed by a compiler program into a sequence of machine instructions which typically has a little resemblance to the sequence prepared by the user. Precisely the dissimilarity between the user program and the machine program makes debugging long and difficult. Little influence is left to the user on the actual performance of the computer and on the efficiency of the processing. If he wants to control the actual execution, he has to go to the painful task of programming in assembler or machine language. Moreover, the dependency on a compiler for the automatic translation of the user program into the machine program makes the high level language more rigid than would be desirable.

In the CPL system, the programming is made in two steps: (1) an FSM (or group of FSMs), as defined in Section 1.3, is invented by the user, such that, with the dynamic of its states and transitions, performs the desired process in the preferred way. The FSMs are described with the user notations (Part 3); the end product is a state diagram, an example of which is in FIG. 26.

(2) the elements constituting the FSMs defined in step 1 are expressed in the machine language. In this step, because limitations of the available machine modifications may be needed to the FSMs prepared in step 1.

Because of this procedure, the user has complete freedom to devise the execution he prefers, expressing it in a concise, problem oriented language. Moreover, because the actual actions of the computer follow very closely the abstract FSMs he devised, debugging, modification and documentation of programs is simple. Here we can say that rather than deforming the problems because of the rigidity of computers, we form the computer in accordance to the problems.

As an example of programming, a processing of radar signals in real-time for detecting faint meteors is considered. The meteors of interest produce a narrow radar echo that rises in intensity (typically below the noise) in the first few pulses and then decays exponentially. Ionospheric echoes of a different pattern, and all sorts of interference should be rejected as much as possible. Matrices showing the meteor rates versus echo energy and duration are to be recorded on magnetic tape, alone with auxiliary information, at periodic times.

We want the entire process executed by the CPL system as embodied in the present specification, with the language described in the tables of Part 3, with input line $\xi_1$ connected (through an analog-digital converter) to the radar output, input line $\xi_2$ connected to the synchronism pulse of the radar, line $\xi_3$ to digits of a time clock, $\xi_4$ to a stop command, and the output buffer P.9 (FIG. 12) connected to a tape recorder.

As a first step, an abstract machine is devised that, with the functions of its states, the dynamics of the transitions, and the organization of the pages, performs the desired tasks. The freedom available in devising such a machine constitutes one of the main practical advantages of the present invention, with respect to the general-purpose computers of prior art. For the particular problem at hand, a page organization as in FIG. 25 is conceived. A first page $\pi 1$ is assigned to an FSM1 that will control the entire process; a sequence of pages $\pi 2.1 \ldots \pi 2.n$ are assigned to an FSM2 that will recognize meteor adjacent ranges; and a page $\pi 3$ will be assigned to an FSM3 for providing the auxiliary information. All these pages form a segment of circulating pages. Moreover, a segment $\pi 4$ of the storage medium is organized as a functional memory for the production of the matrices.

FSM1 is devised as in the state diagram of FIG. 26a. State 1, the initial state (dashed arrow), establishes the configuration of the memory. The variable A is increased by one every cycle; a first transition occurs for $A=1$, and a segment of length m is reserved (routing 1 of Table 12); then, an "else" transition occurs, with the consequent routing of key 2 into adjacent memory locations, thus creating n circulating pages for FSM2; finally, at the transition $A=n+2$, one page for FSM3 is created. During all these cycles of FSM1, the pages are not circulating (transition k in Section 3.3). In state 1, variable C acquires a value t which is the desired time periodicity for the records.

In state 2, one circulation for all the pages is allowed every time the synchronism signal $\xi_2$ is $=1$, thus synchronizing the page processing to the radar. When the present time in $\xi_3$ matches the value in C, transfer to state 3 occurs. In state 3, the values presently stored in the functional memory, in locations 1 to m, are read into B and routed to the output buffer. Then, in state 4, also the auxiliary information in A' and D' is routed to the output, the FSM2 pages are driven to state 1, and a record is ordered. This process repeats from state 2, until the signal "stop" appears in line $\xi_4$; thus, from state 4, the page disappears (transition 1).

FSM2 is dedicated to the recognition of meteor echoes and it is performed by all the $\pi 2$ pages which circulate in synchronism with said radar pulse, thus each one receiving from $\xi_1$ a radar sample sum related to a particular range. Each page in the initial state 1, continuously produces an accumulation Ac of five samples (transition STAY, 511), and compares it with a threshold in A' (produced by FSM3). If the accumulation is larger than the threshold, the page computes a new accumulation, transition 512. In the same time, all the samples are accumulated also in En for a tentative measurement of the energy of a possible meteor. Also, Cn counts a 1, at each cycle. However, every time an accumulation of five samples is not larger than the threshold, the "else" transition 513 occurs, and all the variables are reset to zero (routing 1 of Table 11). A transition to state 2 can occur only when, for 20 consecutive pulses, the accumulations were above the threshold, condition which is assumed to be indicative of the presence of a meteor echo. When a page goes to state 2, it carries the energy of the first 20 pules in En.

State 2 has the task of measuring the duration of the echo in steps of 20 pulses (transition 521). Each accumulation Ac of 20 samples is compared with a threshold h, if it is not less, the page returns to state 2, transition 523, with routing an input prescription 10 of Table 12; because of this prescription, every time the page reenters state 2 through transition 523, En accumulate an input value k. Thus, when the energy will be plotted in the form of a square matrix, it will appear one row down for every duration of 20 pulses of the echo:

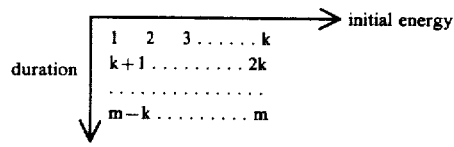

When the echo disappears, or the energy exceeds the maximum value q that it can have in the matrix, the page follows transition 523 which contains the routing of the energy to the distribution function (8 of Table 13). In this way, each recognized meteor increases by one the entry of the matrix in which the initial energy and duration fall. However, because of the prescription (1) at the transition 521 (type g in Section 3.3), every time the signal S' in the array B.12 is max, the page transfers to state 3 without routing to the matrix, transition 522; this means that it is a tail of a meteor already recognized at the previous range, due to the fact that pages in state 1 (meteor not yet recognized) set S' to zero, the pages in state 2 or 3 (meteor recognized) set S' to max.

State 3 has the task of avoiding recognizing as a new meteor revivals of the echo that might appear after a temporary fading. A page returns to state 1 only when an accumulation of 128 echoes does not exceed a certain value g.

FSM3 measures the present mean value of the noise, the rate of disturbances exceeding a certain value e, and stores this information in array B.12 for the use of the other FSMs. In state 1, one thousand samples not exceeding e are accumulated, while in state 2, D is incremented by one for each excess of e. In state 3, the noise accumulation is brought to an appropriate value for constituting a threshold and then the new information replaces the previous information in B.12.

Figure 26:
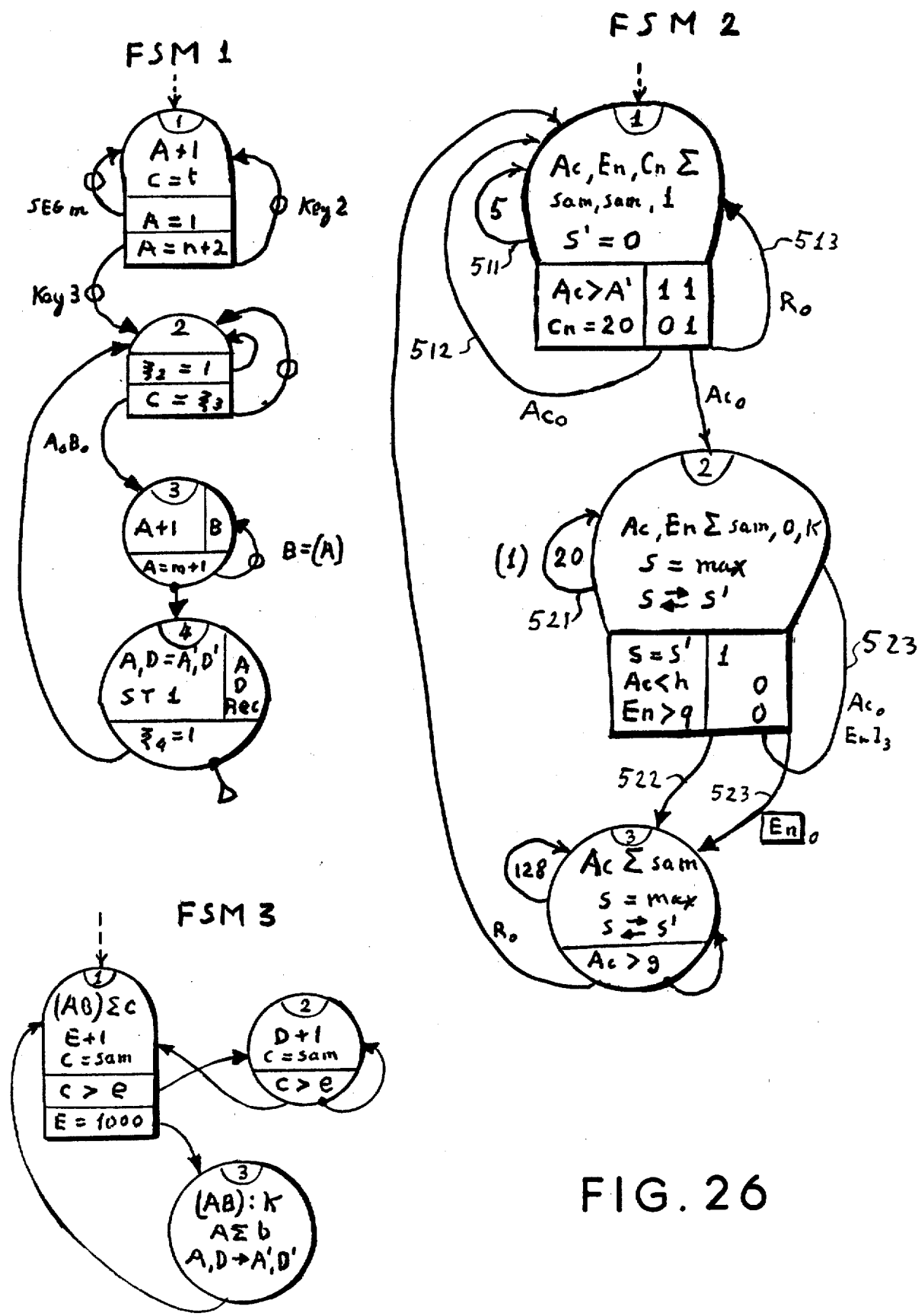
FIG. 26 is a state diagram of a program.

FIG. 26 represents the entire program for the desired process, including all the information that is necessary to give the CPL system for the actual execution of the process. It should be clear that such a representation is more concise and easier to understand than the several pages of listings of an equivalent program written in any programming language of prior art. If the program expressed with graphical and alphanumerical means in FIG. 26 has to be transmitted through conventional means, such as a keyboard, all the items of the program are expressed in the form of memnonic codes, with one to one correspondence with the elements of FIG. 26, in a manner similar to that used in step 2.

The second step consists of expressing the same information that is in FIG. 26 by means of the binary words indicated in Tables 1 through 13. With what has been said in Part 3, and with the help of the comments below, the program in machine language results as:

| codes | comments | | |
|---|---|---|---|
| - - 0(t in binary) | FSM 1, | state 1, | 1 |
| 000111000011000000 | | | F |
| 000000000000100000 | | | |

-continued

| codes | | | comments | |
|---|---|---|---|---|
| 0010100000000000001 | 011000000001 | 10000(m binary) | | T and R |
| 0010100(m+2 binary) | 011000000010 | 100010110010 | | |
| | 011000000001 | 100010100010 | | |
| - - 1010 | | | state 2, | I |
| 1011100000000000000 | 000000000010 | | | T and R |
| 0110100000000000000 | 000000000011 | 000111000000 | | |
| | 011000000010 | | | |
| 0001110000110000000 | | | state 3, | F |
| 0010100(m+1 binary) | 000000000100 | | | T and R |
| | 011000000011 | 100110100010 | | |
| | | 001001000000 | | |
| - - 1100 | | | state 4, | I |
| 0000000001110010000 | | | | F |
| 1010000100000000001 | | | | |
| 1101011100000000000 | 000000011111 | | | T |
| | 000000000010 | | | |
| 1001 1001 0001 | | FSM 2, | state 1, | I |
| 0000010000011100000 | | | | F |
| 0001111000000001000 | | | | |
| 1100010000000000000 | 100000000001 | 000000000101 | | T and R |
| 1100011001110000000 | 010010000001 | 000110000000 | | |
| 1100110100001010000 | 010100000010 | 000110000000 | | |
| | 000000000001 | 000111100000 | | |
| 1001 0000 1(k binary) | | | state 2, | I |
| 0000010000011000000 | | | | F |
| 0001110100000100000 | | | | |
| 0000001101100100000 | | | | |
| 1100010000000000000 | 110000000010 | 000000010100 | | T and R |
| 1100110101100000000 | 000000000011 | | | |
| 11000111000(h bin.) | 000010100010 | 000110000000 | 11000010011 | |
| 11001010000(q bin.) | 000000000011 | 101110100000 | | |
| 1001 | | | state 3, | I |
| 0000010011110000000 | | | | F |
| 0001101000001000000 | | | | |
| 0000000011000100000 | | | | |
| 1100010000000000000 | 100000000011 | 000010000000 | | T |
| 11000110000(g bin.) | 000000000011 | 000110000000 | | |
| | 000000000001 | 000111100000 | | |
| 0 0 1001 | | FSM 3, | state 1, | I |
| 00100100000110110110 | | | | F |
| 0001110000100001000 | | | | |
| 000000000000100000 | | | | |
| 11001110000(e bin.) | 000000001010 | | | T |
| 1101001100000000000 | 000000000011 | | | |
| - - 1001 | | | state 2, | I |
| 0001110000100010000 | | | | F |
| 000000000000100000 | | | | |
| 11001110000(e bin.) | 000000000010 | | | T |
| | 000000000001 | | | |
| 0(k bin.) 0(b bin.) | A | | state 3, | I |
| 0011000000011000001 | | | | F |
| 0010010000010100010 | | | | |
| 0000000110110010000 | | | | |
| | 000000000001 | | | |

What is claimed is:

1. A programmable network for simultaneously processing sets of variables, comprising:
   a plurality of registers X for holding page variables $x_i$;
   a plurality of registers X' for holding auxiliary variables $x'_i$;
   a plurality of registers U for holding input data $u_i$;
   a plurality of registers W for holding program words $w_{j,i}$;
   decoding means having an input receiving said program words $w_{j,i}$ and providing a plurality of outputs having control signals thereon;
   control lines connected with said plurality of outputs of said decoding means for carrying control signals therefrom;
   a plurality of operational means capable of performing arithmetic and logical functions, each said operational means having function-control inputs connected to said control lines, an output connected to the input of one of said registers X and X' to supply resulting data thereto, and inputs multiplexed to the outputs of said registers X, X', and U with said multiplexing being controlled by said control signals carried by said control lines; and
   timing means, responsive to said control signals carried by said control lines, for establishing a cycle of operation by clocking said resulting data into said registers X and X', with the termination of each said cycle causing a new program word $w_{j,i}$ to be fed to said input of said decoding means whereby, for each said cycle, new values are simultaneously produced and stored in said registers X and X' as a function of the previous values in said registers X and X', of the values in said registers U, and of the content of program words $w_{j,i}$ fed to said input of said decoding means.

2. The programable network of claim 1 wherein each of said plurality of registers X, X', and U includes capacity to store at least four binary digits with each said register X having an operational means multiplexed to at least one register X', one register U, and another register X, and with at least one said register X having said operational means further multiplexed to all other said registers X.

3. The programmable network of claim 1 wherein said decoding means includes:

a plurality of first and second bistable elements with each of said first bistable elements being connected in cascade with a different one of said second bistable elements, and with each of said first bistable elements having an input connected to one output of said decoding means and each of said second bistable elements having an output connected to one of said control lines;

means for simultaneously resetting all of said first bistable elements at the beginning of a sequence of said program words $w_{j,i}$ received by said input of said decoding means;

means for individually setting said first bistable elements when an activating control signal arrives at said input of said first bistable elements from said decoding means; and means for parallel transfering the content of all said first bistable elements into said second bistable element connected therewith at the end of said sequence of program words $w_{j,i}$ fed to said input of said decoding means so that said programmable network, responsive to said control signals carried by said control lines, executes, in a single cycle, all the operations prescribed by each word $w_{j,i}$ of said sequence, while a next sequence of words $w_{j,i}$ is being utilized to introduce new content into said first bistable elements.

4. The programmable network of claim 3 wherein said decoding means includes:

an electrically-alterable-read-only-memory (EAROM) with data inputs and outputs and having address inputs receiving said program words $w_{j,i}$;

a plurality of totempole digital switches each of which has a first input connected jointly with one said data input of said EAROM and to the output of one of said second bistable elements, a second input connected to the data output of said EAROM that corresponds to said data input of said EAROM, and an output connected to one of said control lines;

means for writing into said EAROM the content of said second bistable elements accumulated from a sequence of program words $w_{j,i}$ fed to said input of said decoding means after recognition of specific program words $w_{j,i}$ a part of which is fed to said address input of said EAROM; and means for recognizing other specific program words $w_{j,i}$, and consequently feeding part of these words to said address input of said EAROM and positioning said totempole switches to their second input so that program words are read from said EAROM to produce control signals in said control lines responsive to single program words $w_{j,i}$ fed to said input of said decoding means.

5. A data processing apparatus, comprising:
a programmable network having:
a plurality of registers X for holding page variables $x_i$;
a plurality of registers X' for holding auxiliary variables $x'_i$;
a plurality of registers U for holding input data $u_i$;
a plurality of registers $W_{FT}$ for holding programs words $w_{F,i}$ and $w_{T,i}$;

first decoding means having an input receiving said program words $w_{F,i}$ and $w_{T,i}$ and providing a plurality of outputs having control signals thereof;

control lines connected with said plurality of outputs of said first decoding means for carrying control signals therefrom;

a plurality of operational means capable of performing arithmetic and logical functions, each said operational means having function-control inputs connected to said control lines, an output connected to the input of one of said registers X and X' to supply data thereto, and inputs multiplexed to the outputs of said registers X, X', and U with said multiplexing being controlled by said control signals carried by said control lines;

first timing means, responsive to said control signals carried by said control lines, for establishing a cycle of operation by clocking said data into said registers X and X', with the termination of each said cycle causing a new program word $w_{F,i}$ and $w_{T,i}$ to be fed to said input of said first decoding means whereby, for each said cycle, new values are simultaneously produced and stored in said registers X and X' as a function of the previous values in said registers X and X', of the values in said registers U, and of the content of program words $w_{T,i}$ fed to said input of said first decoding means;

a register K for holding a key word including a state label;

means for updating said state label as a function of the then present values in said registers X, X', and U, and of the content of program words $w_{T,i}$ fed to said input of said first decoding means; and a plurality of registers $W_R$ for holding program words $w_{R,i}$;

a packer having:
pluralities of registers $x^P$, $W_R^P$, and a register $K^P$, all of said registers having one-to-one correspondence with respect to said registers X, $W_R$, and K of said programmable network;

means for operatively transfering in parallel the content of said registers X, K, and $W_R$ of said programmable network into said corresponding registers $X^P$, $K^P$, and $W_R^P$ of said packer;

an output buffer with an input;

a packer bus connected to the ouput of said registers $X^P$ and $K^P$ and to said input of said output buffer;

second timing means for establishing a packer cycle in which the content of said registers $X^P$ and $K^P$ are transfered one at a time into said packer bus, in conjunction with production of a page-auxiliary-signal, at the beginning of said packer cycle, and a word-auxiliary signal at the transfer of the content from each said register $X^P$; and second decoding means receiving program words $w_{R,i}$ from said $W_R^P$ registers for skipping the transfer of a specific variable $x_i$ from said register $X^P$ to said packer bus responsive to specific program words $w_{R,i}$, altering the order sequence of said transfering of variables $x_i$ to said packer bus responsive to other specific program words $w_{R,i}$, and transfering specific variables $x_i$ in said registers $X^P$ into said output buffer responsive to further specific program words $w_{R,i}$;

a page memory, having:
a serial storage with a data input connected to said packer bus and an auxiliary signal input receiving said page- and word- auxiliary-signals, and a data and auxiliary-signal outputs; and
means for feeding into said serial storage a page of data, comprising said key word, said page variables $x_i$ and said auxiliary signals, for each cycle of the packer;

a program memory with an output, addressable in blocks of program words $w_{I,i}$, $w_{F,i}$, $w_{T,i}$, and $w_{R,i}$, and an assembler having:
pluralities of registers $X^A$, $U^A$, $W_{FT}^A$, $W_R^A$, and a register $K^A$, all of said registers having a one-to-one correspondence with respect to said registers X, U, $w_{FT}$, $W_R$, and K, respectively, of said programmable network;
a plurality of registers $W_I^A$;
an assembler bus connected to said data output of said page memory and to the input of said registers $K^A$ and $X^A$;
a program bus connected to said output of said program memory and to the input of said registers $W_{FT}^A$, $W_I^A$, and $W_R^A$;
an input data bus connected to the input of said registers $U^A$;
third timing means for establishing an assembler cycle, responsive to the page- and word- auxiliary-signals from said auxiliary-signal output of said page memory, for transferring into said registers $K^A$ and $X^A$ from said assembler bus a page of data including a key word and a plurality of page variables $x_i$;
control means for fetching a block of program words $w_{I,i}$, $w_{F,i}$, $w_{T,i}$, and $w_{R,i}$ into said registers, $W_I$, $W_{FT}^A$, and $W_R^A$ respectively, from said program memory, addressed by said state label in said register $K^A$,
control means for fetching input data $u_i$ into said registers $U^A$, responsive to content in said registers $W_I$; and
means for transferring in parallel the page of data held by registers $K^A$, $X^A$, $U^A$, $W_{FT}^A$, and $W_R^A$ into the corresponding registers K, X, U, $W_{FT}$, and $W_R$ of the programmable network;
whereby a plurality of said pages, acquiring program blocks, responsive to the present state label, and new data in said assembler, executing operations, exchanging data through the registers X', and updating the state label in said programmable network, and routing data into said output buffer in said packer, carry out a plurality of independent and dependent processes.

6. The data processing apparatus of claim 5 wherein said apparatus includes a FIFO page memory implemented with a random access storage, comprising:
a write-counter, and a read-counter; means for multiplexing the address of said random access storage to said write-counter while writing words from said packer, and to said read-counter while reading by part of said assembler; and means for incrementing by one said write-counter for each word written, and incrementing by one said read-counter for each word read, being said counting circular;
so to relocate in adjacent storage locations, circulating pages of changing size.

7. The data processing apparatus of claim 6 wherein said FIFO page memory further includes:
a first adder with an output connected to the address lines of said random access storage, and a first input connected to said write-counter while writing and to said read-counter while reading;
a second adder with an output connected to a second input of said first adder, a first input connected to a reservation-register, and a second input connected to the output of an accumulator;
a boundary-register with output connected to the input of said accumulator and to the input of a comparator whose other input is connected to said address lines of said randon access storage;
first, second, and third sets of registers, for interchanging content with said write-counter, read-counter and boundary-register, respectively;
means for transferring words from said packer into said reservation, boundary and first, second and third sets of registers responsive to specific codes in said registers $W_R^P$ of said packer; and
means for interchanging the content between the write-counter, read-counter, and boundary-register and their corresponding registers, responsive to specific said control signals of the packer, whereby at each transfer the previous content in said boundary-register is added to the content in said accumulator, and wherein, at each equality recognized by said comparator, said write-counter or read-counter is reset, whichever executed the last increment by one so that said random access storage is caused to be partitioned in a reserved region, determined by the content in said reservation-register, and in several segments of circulating pages, determined by the content in said boundary-register and its interchanging registers.

8. The data processing apparatus of claim 5 wherein said packer bus transmits data pages, wherein said packer includes means for producing control signals responsive to content in said registers $W_R^P$, and wherein said apparatus includes:
a page FIFO storage with input connected to said packer bus;
a randon access storage;
a controllable functional element with first and second inputs, and an output connected to the input of said random access storage;
an address register with an input connected to said packer bus and an output addressing said random access storage;
a data register with an input connected to said packer bus and an output connected to said first input of said functional element;
a buffer register with an input connected to the output of said random access storage and an output connected to said second input of said functional element;
first transfer means for transferring a first word into said address register and another word into said data register from said packer bus;
second transfer means for transferring into said buffer register the content addressed in said random access storage;
third transfer means for transferring into the addressed location of said random access storage the content at the output of said functional element;
fourth transfer means for transferring the content addressed in said random access storage into the present input location of said page FIFO storage, said first, second, third and fourth transfers being responsive to specific ones of said control signals of said packer;

whereby data from said pages is selectively stored in said random access storage according to predetermined functions, and whereby data is transferred from said random access storage into said pages.

9. The data processing apparatus of claim 5 wherein said packer has serial binary-data output and means for producing an auxiliary signal, wherein said assembler has serial binary-data input and means for receiving an auxiliary signal, and wherein said apparatus also includes:

a transmission channel carrying three orthogonal waveforms; and input and output means in said channel for generating and selectively detecting said three waveforms, connected to said packer outputs and assemble inputs, respectively, so that two said waveforms are related to the two values of the binary data, and one said waveform is related to the presence of said auxiliary signal.

10. A method of multiprocessing by way of circulation of data pages through a series of pipelined stations having an assembler for acquisition of data, a programable network for data transformation, and a packer for routing of data, said method comprising the steps of:

storing in a program memory pluralities of program blocks, each block including a plurality of codes I for addressing and representing input data, a plurality of codes F for configuring said programable network to implement data transformations, a plurality of codes T for configuring said programable network to implement transition functions selecting a state label, and a plurality of codes R for routing data to specified locations;

introducing into said circulation a data page including a said state label;

processing each said data page introduced into said circulation including acquiring by said page in said assembler one said program block, responsive to said state label in the said circulating data page, and new input data, responsive to said I codes in said program block; executing a succession of data transformations on said page by means of operational configurations in said programable network, responsive to the succession of said codes F in said program block; substituting said state label in the page by means of operational configurations in said programable network, responsive to said codes T in said program block; and routing data from said page in said packer to locations specified by said codes R of said program block, wherein one said location is said circulation itself, thus creating a new page in said circulation; and terminating processing of each said data page when the new state label is the one selected for the page disappearing.

11. The method of claim 10 wherein one said code F in said program blocks includes a state label and instruction of depositing it in said programable network so that a successive page having said state label substituted therein disregards its own codes T and acquires said state label deposited in the programable network;

one said code T in said program block includes an indication of priority; and one said state label comprises a sequence of pairs of items, whereby the first item in each pair is a state label and the second item a number, so that a page with such a state label, in its successive said steps acquires a program block in accordance with said first item in the first said pair, for as many steps as the number constituting said second item in the pair, and disregards responding to said codes T of the acquired program block except for such codes T which carry said priority indication and except if a said deposited state label is present in the programable network, and repeating said described program acquisition for all successive pairs in said sequence of pairs.

12. The method of claim 10 wherein one said code R in said program block includes the indication of a state label, thereby said code R is executed only if the newly selected state label in the page equals said state label indicated in said code R.

* * * * *